United States Patent
Hasegawa et al.

(10) Patent No.: US 7,538,487 B2
(45) Date of Patent: May 26, 2009

(54) ORGANIC EL DISPLAY DEVICE INCLUDING ANOMALOUS DISPERSION LAYER

(75) Inventors: Toshinori Hasegawa, Yokohama (JP); Hiroshi Matsuda, Isehara (JP); Masahiro Okuda, Sagamihara (JP); Masataka Yashima, Tokyo (JP); Koichi Fukuda, Tokyo (JP); Nobutaka Mizuno, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 54 days.

(21) Appl. No.: 11/534,334

(22) Filed: Sep. 22, 2006

(65) Prior Publication Data

US 2007/0069641 A1    Mar. 29, 2007

(30) Foreign Application Priority Data

Sep. 29, 2005  (JP)  ............................. 2005-283896
Sep. 15, 2006  (JP)  ............................. 2006-250565

(51) Int. Cl.
H05B 33/04    (2006.01)
H05B 33/10    (2006.01)

(52) U.S. Cl. ...................................... 313/504; 313/506

(58) Field of Classification Search ......... 313/504–506; 428/690
See application file for complete search history.

(56) References Cited

U.S. PATENT DOCUMENTS

| 5,811,817 | A * | 9/1998 | Ravich ........................ 250/372 |
| 7,045,949 | B2 | 5/2006 | Yamada et al. .............. 313/504 |
| 7,163,831 | B2 | 1/2007 | Hasegawa et al. ............ 438/22 |
| 7,187,121 | B2 | 3/2007 | Hasegawa et al. ........... 313/504 |
| 2002/0190639 | A1 | 12/2002 | Yamada et al. ............... 513/504 |
| 2004/0156405 | A1 | 8/2004 | Asai et al. ...................... 372/39 |
| 2006/0017050 | A1 | 1/2006 | Hasegawa et al. ............. 257/40 |
| 2006/0017374 | A1 | 1/2006 | Hasegawa et al. ........... 313/503 |
| 2007/0042517 | A1 | 2/2007 | Haseqawa et al. ............. 438/22 |
| 2007/0096641 | A1 | 5/2007 | Hasegawa et al. ........... 313/504 |

FOREIGN PATENT DOCUMENTS

| JP | 09-127885 | 5/1997 |
| JP | 2002-373776 | 12/2002 |
| JP | 2004-164890 | 6/2004 |
| WO | WO 2004-044998 | 5/2004 |
| WO | WO 2006054137 A1 * | 5/2006 |

* cited by examiner

Primary Examiner—Nimeshkumar D. Patel
Assistant Examiner—Anne M Hines
(74) Attorney, Agent, or Firm—Fitzpatrick, Cella, Harper & Scinto

(57) ABSTRACT

There is provided a display device which quenches ambient light by using only an optical interference effect without additionally using an optical filter such as a color filter, and can provide good visibility out of doors in the daylight. The display device includes a plurality of organic EL elements each having a light extraction electrode, a reflective electrode, and a plurality of organic compound layers disposed between the electrodes, wherein the plurality of organic EL elements include at least organic EL elements which emit a red light, a green light, and a blue light, respectively; a layer comprised of a material having anomalous dispersion is disposed at a location which is on a light extraction side with respect to the reflective electrode in each of the plurality of organic EL elements; and an ambient light reflectance of the display device shows a minimal in a region of 535 nm or more and 575 nm or less.

5 Claims, 11 Drawing Sheets

ORGANIC EL DISPLAY DEVICE INCLUDING ANOMALOUS DISPERSION LAYER

BACKGROUND OF THE INVENTION

1. Field of the Invention

The present invention relates to a display device employing light-emitting elements using an organic compound, and more particularly, to a display device using organic electroluminescence (EL) elements that emit light when an electric field is applied to a thin film comprised of an organic compound.

2. Description of the Related Art

Organic EL elements (organic light-emitting elements or organic electroluminescence elements) have been actively researched and developed in recent years. When a display device utilizing any one of such organic EL elements is used in an outdoor environment, ambient light is incident on the organic EL element through a transparent electrode, is reflected on a metal electrode inside the element, is emitted from the transparent electrode, and returns to the outside of the element again. Accordingly, for example, when a display device is used out of doors, the reflection of ambient light or the reflection of outside scenery occurs, thereby leading to a reduction in contrast or the deterioration of image quality.

In view of the foregoing, Japanese Patent Application Laid-Open No. H09-127885 discloses, for example, on page 4, lines 61-66 and in FIG. 2, a method of preventing a reduction in contrast or the deterioration of image quality by disposing a circularly polarizing plate on a display surface of a display device.

Further, Japanese Patent Application Laid-Open No. 2002-373776 discloses, for example, on page 3, lines 64-82 and in FIG. 2, a method of reducing an influence of the reflection of ambient light by using a combination of a light-absorbing filter and an optical resonator structure.

Moreover, Japanese Patent Application Laid-Open No. 2004-164890 discloses, for example, on page 4, lines 14-20 and FIG. 1, a monochromatic element in which a reduction in reflection of ambient light is achieved by using a quenching effect due to optical interference and a display device in which an influence of the reflection of ambient light is reduced by using a quenching effect due to optical interference and an optical filter such as a color filter in combination.

Besides, WO 2004/044998 discloses, for example, on page 4, lines 9-13 and in FIG. 1, a monochromatic element in which a reduction in reflection of ambient light is achieved with the aid of a quenching effect due to optical interference.

However, with the method disclosed in Japanese Patent Application Laid-Open No. H09-127885, although the suppressing effect on the reflection of ambient light is large, light emitted from an organic EL element as well as ambient light is quenched, so that the resultant luminance is 50% or less. Accordingly, when an attempt to obtain a desired luminance is to be made, the organic EL element needs to generate luminance which is twice or more the desired luminance, with the result that the power consumption increases. In addition, a high load is applied to the element, so that there is posed a problem such as a reduction in the lifetime of the element.

Further, the method disclosed in Japanese Patent Application Laid-Open No. 2002-373776 requires the step of forming the light-absorbing filter on a pixel, thereby causing a problem that a production process for a display device becomes complicated.

Moreover, with the elements and devices disclosed in Japanese Patent Application Laid-Open No. 2004-164890 and WO 2004/044998, although the ambient light reflectance in a wavelength region near the emission color is reduced, the ambient light reflectance in a wavelength region other than the wavelength region of the emission color increases. FIG. 20 is a graphical representation showing the ambient light reflection characteristics of a conventional organic EL element in which the reflection of ambient light is reduced by optical interference and which shows a red (R), a green (G), and a blue (B) emission colors. As shown in FIG. 20, a conventional ambient light quenching method according to an optical interference system has posed a problem that because in a light-emitting pixel portion of, for example, a blue or red emission color, the reflection of ambient light in a green color region cannot be sufficiently reduced, whereby the contrast of a display device is reduced. Accordingly, when the method is to be applied to a display device constituted by a plurality of organic EL elements of different emission colors, another optical means such as a color filter needs to be used in combination, thereby posing a problem that the constitution of the display device becomes complicated and the production cost of the device is high.

SUMMARY OF THE INVENTION

The present invention has been accomplished in view of the above-mentioned problems, and an object of the present invention is to provide a display device which quenches ambient light by using only an optical interference effect without additionally using an optical filter such as a color filter, and can provide good visibility out of doors in the daylight.

According to the present invention, there is provided a display device which comprises a plurality of organic EL elements each having a light extraction electrode, a reflective electrode, and a plurality of organic compound layers disposed between the electrodes, wherein the plurality of organic EL elements include at least organic EL elements which emit a red light, a green light, and a blue light, respectively; a layer comprising a material having anomalous dispersion is disposed at a location which is on a light extraction side with respect to the reflective electrode in each of the plurality of organic EL elements; and an ambient light reflectance of the display device shows a minimal (or local minimum) in a region of 535 nm or more and 575 nm or less in an entire wavelength region of ambient light.

According to the present invention, a treatment for preventing the reflection of ambient light can be performed with the aid of optical interference without providing any optical filter such as a color filter. As a result, there can be provided a display device which, with a simpler device constitution than the prior art, secures good visibility out of doors in the daylight; has a high utilization efficiency of emitted light; and consumes less power.

Further features of the present invention will become apparent from the following description of exemplary embodiments with reference to the attached drawings.

DESCRIPTION OF THE EMBODIMENTS

Hereinafter, the present invention will be described in detail.

Figure 1:
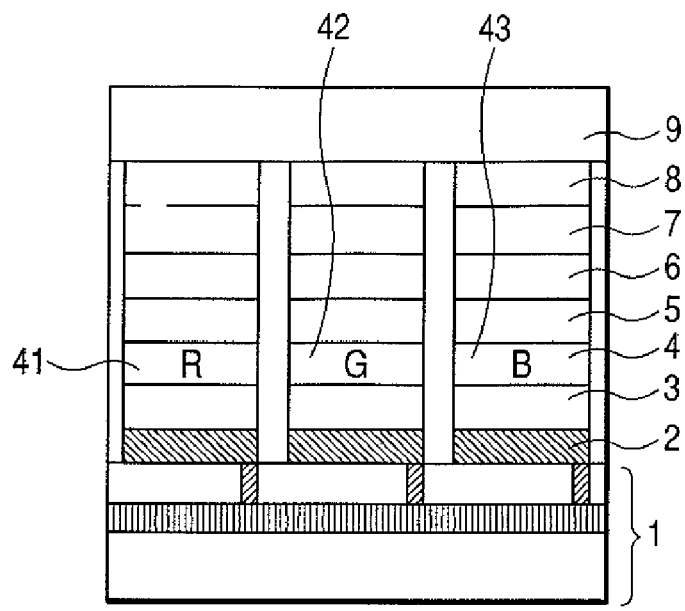
FIG. 1 is a schematic partial cross-sectional view showing an example of the display device of the present invention.

FIG. 1 is a schematic partial cross-sectional view showing an example of the display device of the present invention using an organic EL element.

The display device is composed of a plurality of organic EL elements, and each of the organic EL elements is constituted by sequentially providing, on a substrate 1, a reflective layer (i.e., anode) 2, a hole-transporting layer 3, a light-emitting layer 4, an electron-transporting layer 5, an electron injection layer 6, a cathode 7, a reflectance-adjusting layer 8, and a protective layer 9. For example, in a display device composed of light-emitting pixels for three colors of red (R), green (G), and blue (B), an R light-emitting layer 41, a G light-emitting layer 42, and a B light-emitting layer 43 for electroluminescence (EL) light emission of R, G and B are formed, respectively. When a current is caused to flow these EL elements, holes injected from the anode 2 and electrons injected from the cathode 7 recombine in each of the R, G, and B light-emitting layers 41 to 43, whereby a red light, a green light, and a blue light are emitted from the layers, respectively.

In this embodiment, an example of the constitution in which an anode is formed on the substrate 1 has been shown. However, it is to be noted that an organic EL element may be constituted by stacking on a substrate, a cathode, an organic compound layer, an anode, a reflectance-adjusting layer, and a protective layer in the mentioned order, and that the stacking order of constituent layers of an organic EL element is not particularly limited. Further, although description is made by taking as an example a display device having organic EL elements which emit RGB lights, the display device of the present invention may additionally have at least one organic EL element which emits light of a color other than RGB.

For simplicity, this embodiment shows the constitution in which the anode as a reflective electrode also serves as the reflective layer 2. However, it is sufficient that the reflective layer has such characteristics as to reflect emitted light, and there may be adopted a two-layer structure in which a transparent layer is provided separately from the reflective layer 2 and disposed on a light extraction side with regard to the reflective layer 2. When a transparent conductive layer is used as the transparent layer separately from the reflective layer 2, an insulating member such as a dielectric multilayer mirror can be used as the reflective layer.

The reflectance-adjusting layer 8 is provided for the purpose of reducing the ambient light reflectance of each pixel portion with the aid of optical interference. It is preferable that the reflectance-adjusting layer 8 contains at least a material having anomalous dispersion. The term "anomalous dispersion" herein employed refers to dispersion characteristics in which in a visible wavelength region of 400 nm or more and 700 nm or less, the refractive index increases with increasing wavelength. As a material having anomalous dispersion, any one of the materials such as organic compounds, inorganic compounds, metals, alloys, and composites thereof can be used as long as it shows anomalous dispersion. The configuration of the reflectance-adjusting layer 8 is not particularly limited as long as it can quench or reduce the reflection of ambient light in each light-emitting pixel with the aid of optical interference. As needed, the configuration can be arbitrarily selected from, for example, a single layer of a material having anomalous dispersion, a plurality of layers obtained by combining several materials each having anomalous dispersion, and a plurality of layers obtained by combining a material having anomalous dispersion and an ordinary material. In a case where an optical path (or optical path length) is adjusted in order to set a wavelength at which optical interference is caused, it is preferred that an optical path adjusting layer is disposed in contact with a layer comprising a material having anomalous dispersion. As such layer configuration, there may be adopted, for example, one in which optical path adjusting layers are disposed in contact with the both surfaces of a layer composed of a material having anomalous dispersion or one in which an optical path adjusting layer is disposed in contact with one surface of a layer composed of a material having anomalous dispersion. That is, there are included a three-layer configuration such as optical path adjusting layer/layer composed of material having anomalous dispersion/optical path adjusting layer, and two-layer configuration such as optical path adjusting layer/layer composed of material having anomalous dispersion, or layer composed of material having anomalous dispersion/optical path adjusting layer. A specific example of such layer configuration is one in which layers each composed of silicon dioxide are disposed in contact with both surfaces of a layer composed of a material having anomalous dispersion, that is, a three-layer configuration of silicon dioxide ($SiO_2$)/tungsten carbide (WC)/silicon dioxide ($SiO_2$). The material of such optical path adjusting layer is not particularly limited as long as it can adjust an optical path, which is expressed as the product of refractive index and film thickness, such that the reflectance of ambient light is reduced as far as possible, but is preferably a material with less light absorption. By using such a material with less light absorption, the light extraction efficiency of an organic EL element can further be improved. As such material, there can be used, in addition to silicon dioxide as mentioned above, inorganic compounds such as titanium dioxide, metals such as silver or aluminum, and compounds or mixtures thereof.

In a conventional organic EL element in which the reflection of ambient light is prevented by optical interference, incident ambient lights are reflected by respective portions in the element, and the intensities and phases of the reflected lights are adjusted to quench the ambient light. Meanwhile, the reflection of ambient light results from a difference in refractive index at each stacking interface, and in a general organic EL element, a main site in which the reflection of ambient light occurs is an interface between an organic layer and an electrode which shows the largest refractive index difference inside the element. Therefore, it is sufficient to make an adjustment such that ambient lights each reflected by an interface of one of the pair of electrodes in an organic EL element are substantially identical to each other in intensity and are opposite in phase. The intensity of reflected light is adjusted by selecting the materials of electrodes or organic compound layers, or by changing film thicknesses thereof. Assuming that the wavelength of ambient light to be quenched is λ and a phase shift when the ambient light is reflected by the reflective layer 2 is π (radian), when an optical path L between the reflective layer 2 and a light extraction side interface of the reflectance-adjusting layer 8, that is, an interface between the reflectance-adjusting layer 8 and the protective layer 9 meet the relationship given by Equation (1) below, the state is realized in which the phases of ambient lights reflected by a pair of electrodes are opposite:

$$\lambda/2 \cdot (2m) = 2L \quad (1)$$

wherein m represents a positive integer.

Incidentally, in the case where the phase shift is not π (radian), the optical path length may be changed to thereby adjust and compensate an amount corresponding to excess or shortage of a phase shift necessary for meeting the relationship of Equation (1). Equation (1) shows that the optical path L necessary for attaining the opposite phases (or inversion of phase) varies depending on the wavelength of ambient light to be quenched. Accordingly, an attempt to invert the phase of, for example, ambient light having a long wavelength requires a longer optical path.

Meanwhile, the optical path L is the total sum (n1d1+ n2d2+ . . . ) of the products (nd) of the refractive index (n) and thickness (d) of respective organic compound layers disposed between upper and lower electrodes.

Therefore, Equation (1) is further represented as follows:

$$\lambda/2 \cdot (2m) = 2(n1d1+n2d2+) \quad (1')$$

wherein m represents a positive integer.

Figure 2:
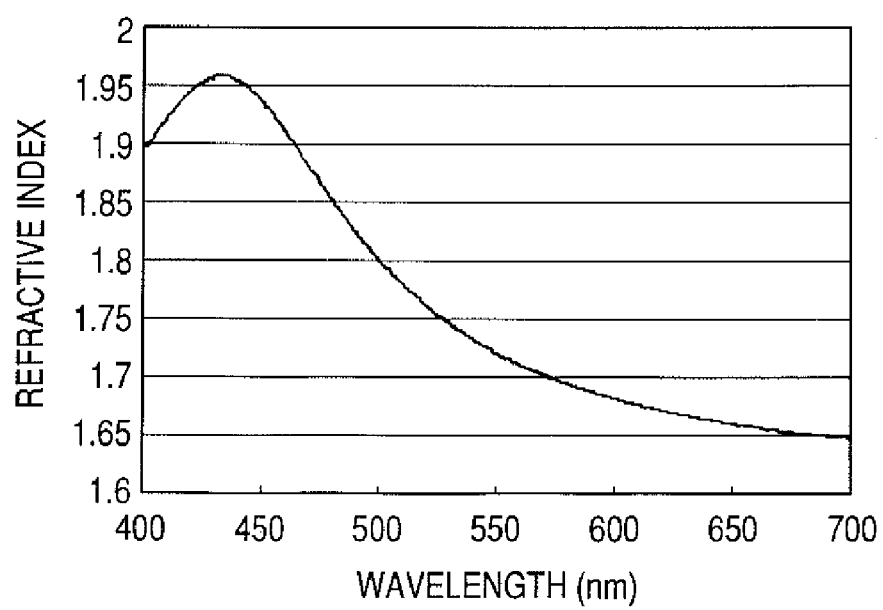
FIG. 2 is a graphical representation showing the wavelength dispersion characteristics of the refractive index of Alq3.

FIG. 2 shows the wavelength dispersion characteristics of the refractive index of Alq3 used as an organic compound layer in an ordinary organic EL element. The refractive index of Alq3 reduces with increasing wavelength in a wavelength region longer than 430 nm. Accordingly, when an attempt to meet Equation (1') at various wavelengths is to be made, the thickness of the organic compound layer needs to be determined while the wavelength dispersion characteristics of refractive index as well as the change in wavelength is taken into consideration.

When calculating the film thickness meeting Equation (1) (in the case of m=1) for various wavelengths by using the dispersion characteristics of refractive index of Alq3, since the refractive index of the material also reduces with increasing wavelength of ambient light to be quenched, the thickness of the organic compound layer needs to be equal to or larger than a difference in wavelength as shown in Table 1.

TABLE 1

| Wavelength of ambient light (nm) | Refractive index | Necessary thickness (nm) |
|---|---|---|
| 400 | 1.90 | 105.5 |
| 450 | 1.93 | 116.4 |
| 500 | 1.80 | 139.1 |
| 550 | 1.72 | 160.0 |
| 600 | 1.68 | 178.6 |
| 650 | 1.66 | 196.0 |
| 700 | 1.65 | 212.7 |
| 750 | 1.64 | 229.1 |

Accordingly, when the thickness of the organic compound layer is fixed to a specific value, ambient light is quenched at a wavelength at which Equation (1') is met by using the thickness value, but Equation (1') cannot be met at any wavelength other than the wavelength.

In order to expand the wavelength band in which ambient light can be quenched with a specific thickness of the organic compound layer, an amount corresponding to a change in wavelength needs to be compensated with a change in refractive index. For example, when the wavelength increases, the refractive index needs to increase. Table 2 shows the results of calculation of refractive indices that meets Equation (1') within a wavelength region of 400 nm or more and 750 nm or less under the condition that the thickness of the organic compound layer is constant (160 nm).

TABLE 2

| Wavelength of ambient light (nm) | Refractive index | Necessary thickness (nm) |
|---|---|---|
| 400 | 1.25 | 160.0 |
| 450 | 1.41 | 160.0 |
| 500 | 1.56 | 160.0 |
| 550 | 1.72 | 160.0 |
| 600 | 1.87 | 160.0 |
| 650 | 2.03 | 160.0 |
| 700 | 2.19 | 160.0 |
| 750 | 2.34 | 160.0 |

As can be seen from Table 2, for meeting the relationship of Equation (1') within the wavelength region of 400 nm or more and 750 nm or less on the condition that the thickness of the organic compound layer is constant, a material having anomalous dispersion in which the refractive index thereof increases with increasing wavelength is necessary. It is preferable that the reflectance-adjusting layer 8 of the present invention is provided with a material having such anomalous dispersion as mentioned above.

It is desirable that the material having anomalous dispersion has an extinction coefficient κ of 3 or less, preferably 2 or less, and more preferably 1 or less from the viewpoint of the fact that EL emitted light absorbed by the reflectance-adjusting layer 8 is reduced, whereby a display device improved in emitted light extraction efficiency can be realized.

Figure 3:
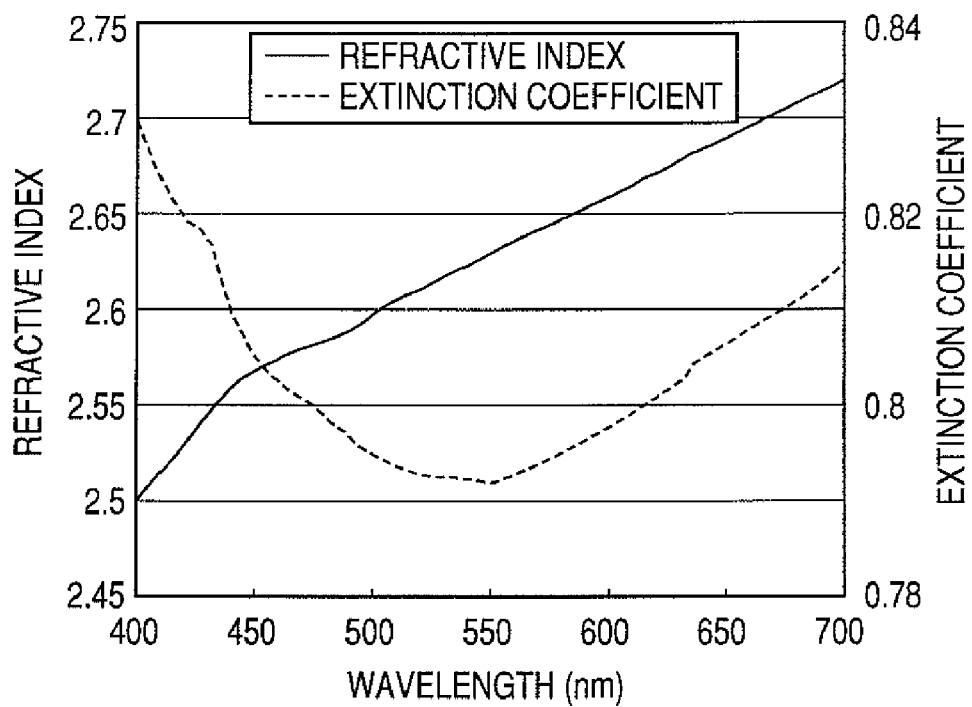
FIG. 3 is a graphical representation showing the wavelength dispersion characteristics of the refractive index and extinction coefficient of tungsten carbide (WC).
Figure 4:
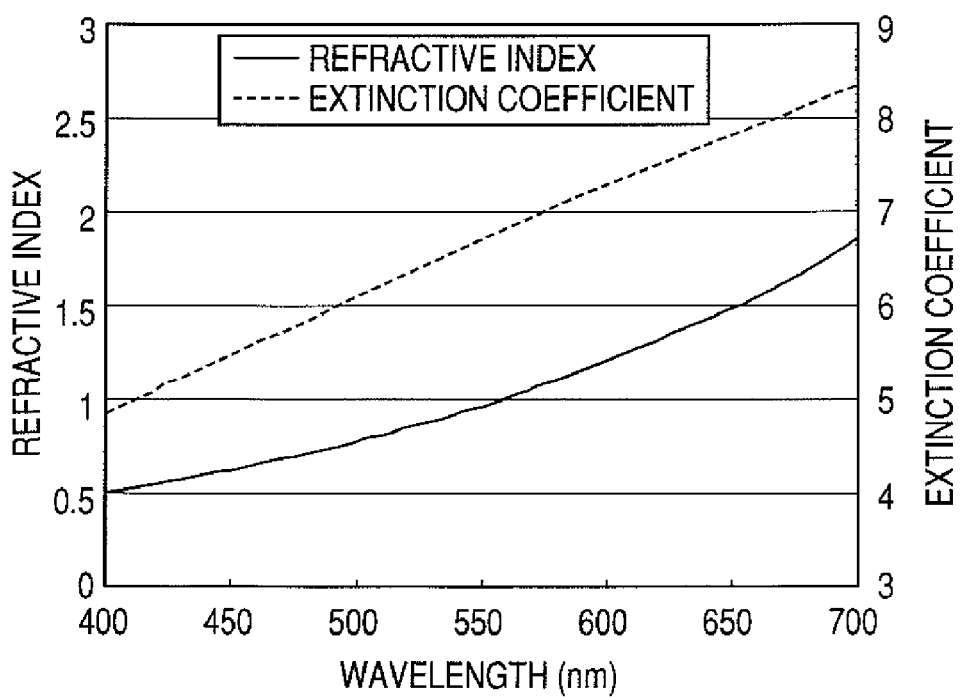
FIG. 4 is a graphical representation showing the wavelength dispersion characteristics of the refractive index and extinction coefficient of metal aluminum (Al).

FIG. 3 shows the dispersion characteristics of the refractive index and extinction coefficient of tungsten carbide (WC) which shows anomalous dispersion. In addition, FIG. 4 shows the dispersion characteristics of the refractive index and extinction coefficient of metal aluminum. As can be seen from FIG. 4, metal aluminum also shows anomalous dispersion, but has an extinction coefficient of 4.8 or more and 8.3 or less (in the wavelength region of 400 nm or more and 700 nm or less), which is larger as compared with that of tungsten carbide. Incidentally, the refractive index and extinction coefficient can be measured by using a spectroscopic ellipsometer.

Meanwhile, the absorption coefficient α of a thin film represents the ratio at which light is absorbed while it travels by a unit length through the thin film, and is represented by Equation (2) below by using an extinction coefficient κ.

$$\alpha = 4\pi\kappa/\lambda \quad (2)$$

In addition, the intensity of light that has transmitted through a thin film having an absorption coefficient α and a thickness z is represented by Equation (3) below on the basis of Beer's law:

$$I(z) = I(0)e^{-\alpha z} \quad (3)$$

wherein I(z) represents the intensity of light at the thickness z and I(0) represents the intensity of incident light.

Therefore, the larger the extinction coefficient κ or the larger the thickness z, the larger the optical absorption loss.

Figure 5:
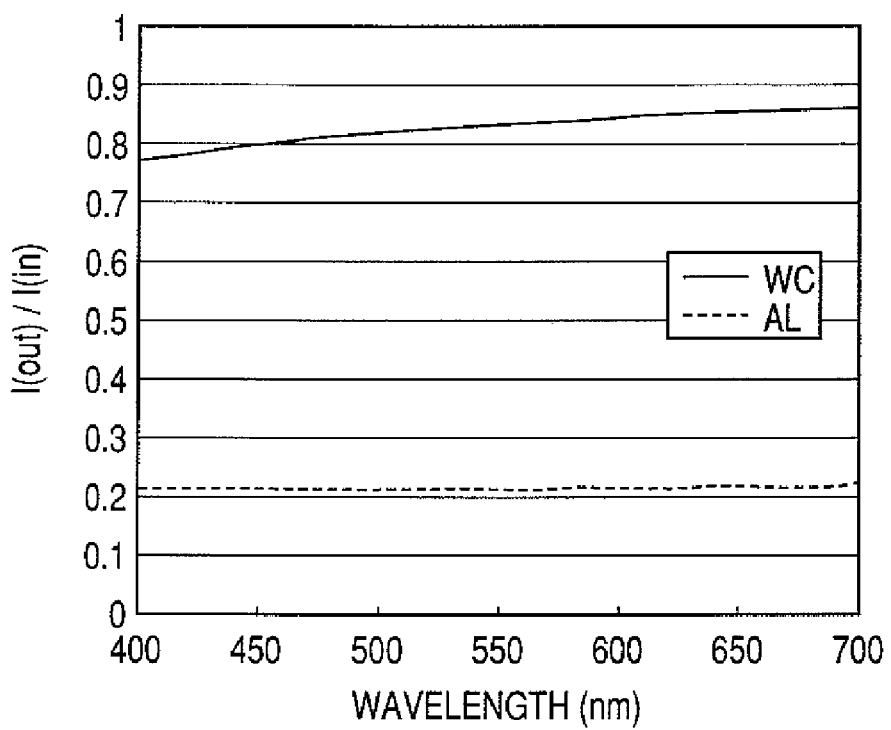
FIG. 5 is a graphical representation showing a ratio of the intensity of light after transmission through each of tungsten carbide (WC) and aluminum (Al) thin films to the intensity of light before the transmission.

FIG. 5 shows the results of the determination of a ratio (I(out)/I(in)) of the intensity of exiting light to the intensity of incident light upon transmission through each of tungsten carbide and metal aluminum thin films each having a thickness of 10 nm by use of Equation (3) above. As shown in FIG. 5, in metal aluminum having a large extinction coefficient, the light absorption is large. Therefore, when metal aluminum is applied to the reflectance-adjusting layer 8, light emitted from an organic EL element is absorbed, and the ratio of the intensity of exiting light to the intensity of incident light, that is, the transmittance of ambient light or light emitted from the EL element tends to reduce. In order that the degree of freedom in the adjustment of the quenching of ambient light may be improved and the emitted light extracted efficiency may be improved, a material having a small extinction coefficient and having anomalous dispersion is preferably used in the reflectance-adjusting layer 8. To be specific, tungsten carbide (WC) is preferable.

The reflectance-adjusting layer 8 may be formed by any method. The formation is preferably performed by means of vacuum evaporation, ionized evaporation, sputtering, or the like. When the reflectance-adjusting layer 8 is formed by general-purpose vacuum evaporation or sputtering employed for forming any other organic compound layers, the cathode 7, or the like, the minimum thickness of the layer is substantially about 10 nm. When the thickness of the reflectance-adjusting layer 8 is 10 nm, in order that the absorption loss may be 50% or less at a wavelength of 550 nm, the extinction coefficient κ needs to be 3 or less according to Equation (2) and Equation (3). In the reflectance-adjusting layer 8 in accordance with the present invention, it is preferable to use a material having an extinction coefficient κ of 3 or less. In a conventional organic EL element that prevents the reflection of ambient light by utilizing polarization characteristics, about 50% of EL emitted light cannot be extracted to the outside and is useless. The reflectance-adjusting layer 8 according to the present invention has a reflection loss of 50% or less, and a higher utilization efficiency of emitted light than that of a conventional organic EL element utilizing a circularly polarizing plate can be expected.

Meanwhile, a display device is evaluated for contrast in bright locations in an external environment by using Equation (4) below.

$$C = (B + \gamma \times A/\pi)/(\gamma \times A/\pi) \quad (4)$$

In Equation (4), C represents an evaluated value for contrast in bright locations, A represents the brightness (lux) of ambient light, B represents the luminance (cd/m²) of the display device, and γ represents the ambient light reflectance (%) of the organic EL element. The term "ambient light reflectance" as employed herein refers to the reflectance of ambient light incident on the front face of the display device. In other words, a high contrast value can be obtained, that is, a display device having good visibility can be realized when the reflectance of the display device is reduced (γ) and the device is caused to emit light as brightly as possible (B) in as dark an environment as possible (A).

Figure 6:
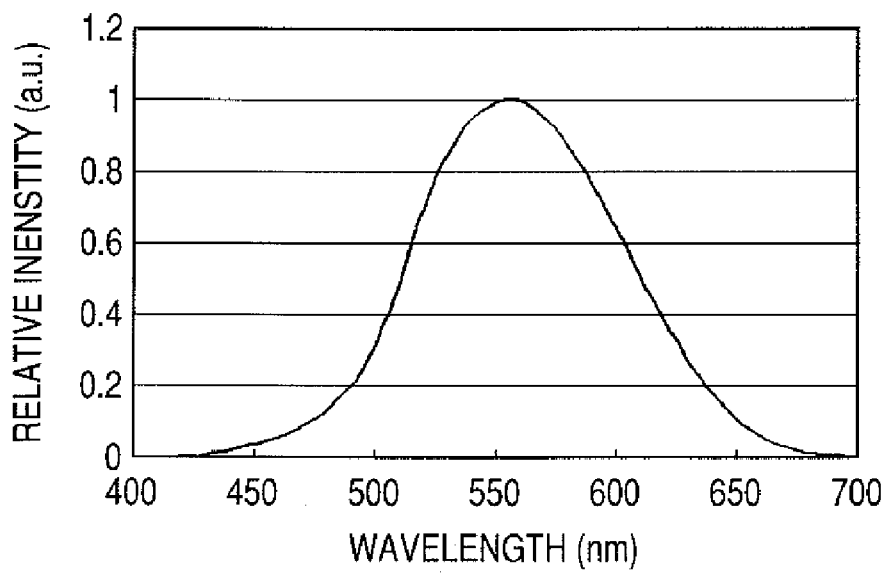
FIG. 6 is a graphical representation showing the visual sensitivity of naked eyes.

In addition, the sensitivity of the naked eye of a human being with respect to the wavelengths of visible light (i.e., spectral sensitivity) is not uniform, and is maximum with respect to a yellowish green light having a wavelength of 555 nm. FIG. 6 shows a visual sensitivity curve representing the sensitivity of a human naked eye. Accordingly, the ambient light reflectance necessary for meeting a predetermined contrast varies depending on the wavelength. For example, when it is assumed that an ambient light reflectance necessary for meeting a predetermined contrast at a wavelength of 555 nm is represented by R, an ambient light reflectance γ(λ) necessary for meeting the predetermined contrast at the other wavelengths can be represented by Equation (5) below by using visual sensitivity l(λ).

$$\gamma(\lambda) = R/l(\lambda) \quad (5)$$

The ambient light reflectance calculated from Equation (5) shows an upper limit value for meeting the predetermined contrast, and it can be said that the predetermined contrast is met when the ambient light reflectance corresponding to the wavelengths of the display device is less than the value of Equation (5).

For example, in the case where the emission luminance of a display device is 300 cd/m², and when one attempts to obtain a contrast value of 10 or more which substantially corresponds to the contrast of newspaper at a bright location corresponding to a brightness of 1,500 lux, the ambient light reflectance needs to be 7% or less according to Equation (4). According to Equation (5), the ambient light reflectances at respective wavelengths necessary for meeting the contrast 10 in the entire wavelength region of 400 nm or more and 700 nm or less are as shown in FIG. 7.

Figure 7:
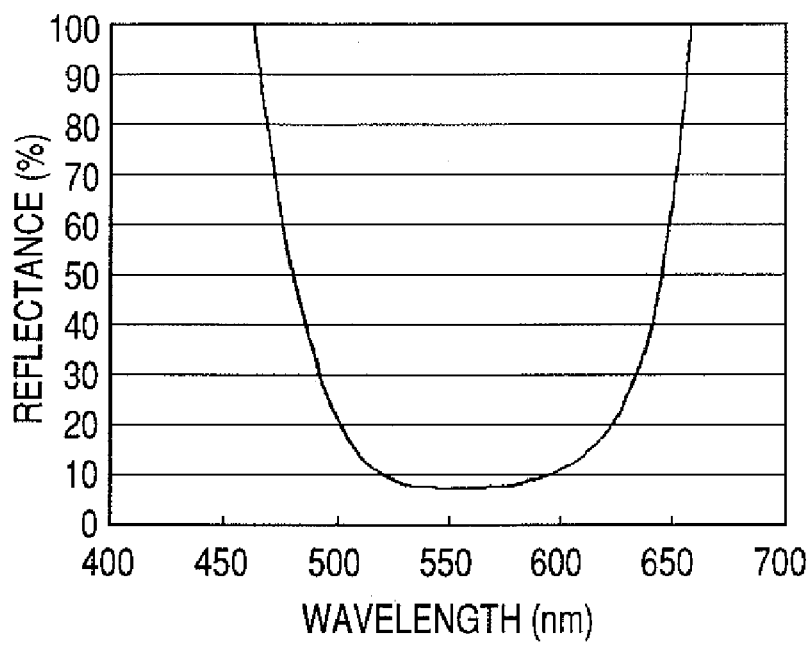
FIG. 7 is a graphical representation showing a relationship between wavelength and ambient light reflectance necessary for meeting a predetermined contrast.

As can be seen from FIG. 7, the ambient light reflectance necessary for meeting contrast 10 under the above-mentioned conditions is substantially constant, that is, 7 to 8% within the region of 535 nm or more and 575 nm or less of the entire wavelength region of ambient light, and the necessary ambient light reflectance shows a minimal in the wavelength region. The reason for the foregoing is as follows. The visual sensitivity of the naked eye is highest and the rate of change in visual sensitivity relative to the wavelength is 10% or less in the wavelength region, so that the ambient light reflectance necessary for meeting the predetermined contrast becomes substantially constant in the wavelength region (i.e., 535 nm or more and 575 nm or less). Accordingly, in order to realize a display device having a high contrast, it is most effective to set the quenching band of the display device in such a manner that the ambient light reflectance in the wavelength region (i.e., 535 nm or more and 575 nm or less) is particularly low, or preferably has a minimal value.

Meanwhile, the visual sensitivity reduces in a wavelength region other the region of 535 nm or more and 575 nm or less. Accordingly, even in the case where the ambient light reflectance in the other wavelength region is high, an influence on a contrast value is slight, so that an influence on the visibility of a display device is small. In view of the foregoing, the quenching center of the ambient light reflectance in a light-emitting pixel of the display device of the present invention is set to the wavelength region of 535 nm or more and 575 nm or less by paying attention to such relationship between the visual sensitivity and the contrast.

Figure 8:
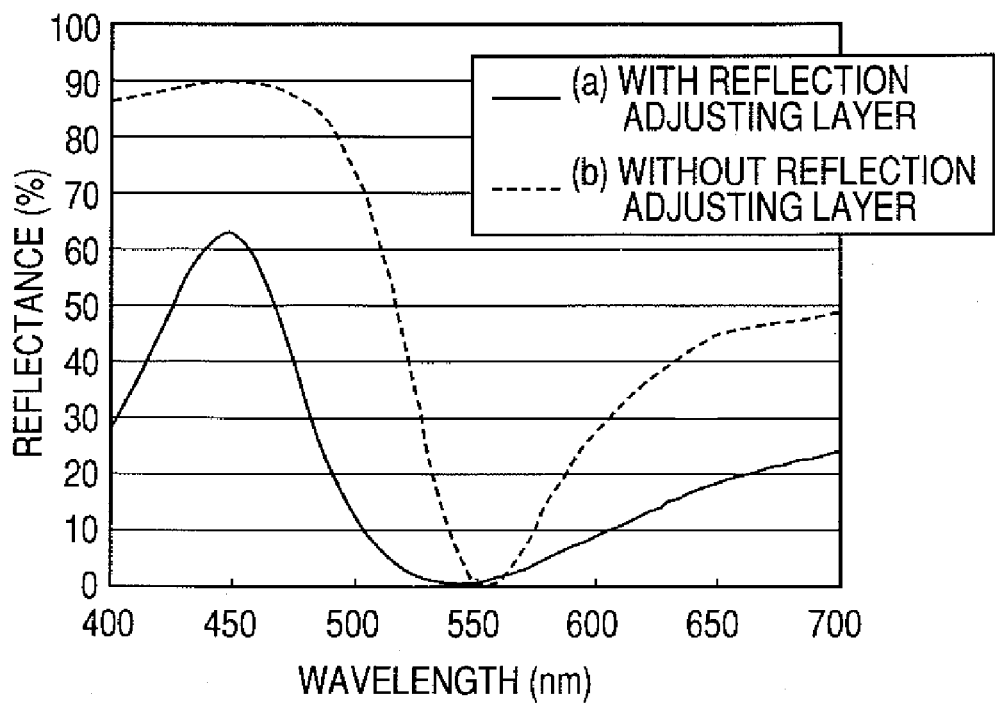
FIG. 8 is a graphical representation showing the ambient light reflection characteristics of an organic EL element.

FIG. 8 shows the ambient light reflectances of an organic EL element using tungsten carbide in a reflectance-adjusting layer having a thickness of 20 nm and a conventional organic EL element using no reflectance-adjusting layer, determined by a general-purpose thin film calculation method. A reflective layer functioning also as an anode and a cathode were each formed of metal aluminum, an organic compound layer had a refractive index of 1.7, and a protective layer having a refractive index of 1.5 was provided for an upper portion of each of the organic EL elements. The optical interference effect in which an organic EL element is involved changes depending on the presence/absence of a reflectance-adjusting layer. In order that the quenching centers of ambient light of the organic EL elements might coincide with each other substantially at around 550 nm, the thicknesses of the organic compound layers of the both elements were set, respectively, to 105 nm in the case where the reflectance-adjusting layer was provided and 120 nm in the case where no reflectance-adjusting layer was provided.

As can be seen from FIG. 8, the quenching wavelength region of ambient light of the organic EL element provided with tungsten carbide as a reflectance-adjusting layer ((a) of FIG. 8) is wider than that of the conventional organic EL element having no reflectance-adjusting layer ((b) of FIG. 8). In the presence of a reflectance-adjusting layer, the wavelength region in which the ambient light reflectance is 10% or less is a region of 505 nm or more and 600 nm or less. In the case of the conventional organic EL element, the wavelength region in which the ambient light reflectance is 10% or less is a region of 540 nm or more and 570 nm or less. As described above, the use of tungsten carbide having anomalous dispersibility in a reflectance-adjusting layer expands the wavelength band meeting Equation (1), thereby enabling the quenching band of the reflection of ambient light to be expanded.

In a conventional organic EL element in which ambient light is quenched by optical interference, the quenching wavelength region has been narrow. Accordingly, when one attempts to quench ambient light in a wavelength region in which the visual sensitivity is relatively high, it has been necessary to additionally use other members such as a color filter to substantially expand the quenching wavelength region. The display device of the present invention eliminates the need for such other members, so that the device configuration is simple. In addition, there is no need for, for example, a step of mounting such other members on a display device, so that a lower-cost display device can be obtained in a high throughput. In addition, the transmittance of an optical filter such as a color filter is about 40 to 80%, so that a conventional organic EL element additionally using such other members has a problem that most of emitted light is cut out by such members and the emitted light extraction efficiency is low. The display device of the present invention has no need for use of such other optical members, so that a high emitted light extraction efficiency is available and a load applied to the display device can be alleviated. Accordingly, a display device with a low power consumption and a long lifetime can be realized.

Figure 9:
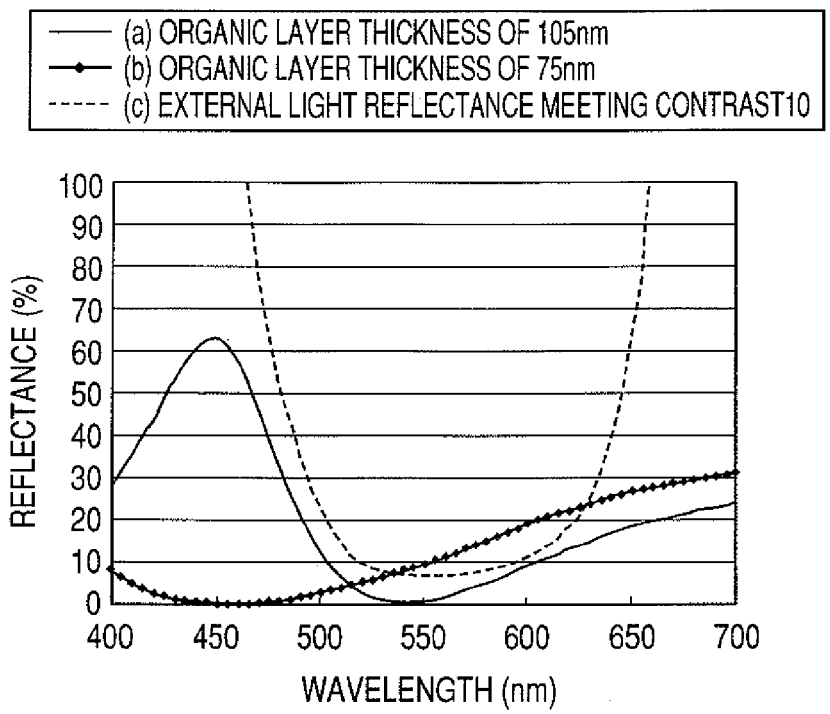
FIG. 9 is a graphical representation showing the ambient light reflection characteristics of an organic EL element and a relationship between wavelength and ambient light reflection characteristics necessary for meeting a predetermined contrast.

FIG. 9 shows the ambient light reflectances of an organic EL element using tungsten carbide in a reflectance-adjusting layer having a thickness of 20 nm in the cases where the thickness of an organic compound layer is set to 105 nm and 75 nm and a quenching center of ambient light is set to 540 nm ((a) of FIG. 9) and 450 nm ((b) of FIG. 9), respectively. In addition, FIG. 9 shows ambient light reflectances ((c) of FIG. 9) necessary for meeting a contrast of 10 under the predetermined conditions shown in FIG. 7 as well. As can be seen from FIG. 9, the ambient light reflectances ((a) of FIG. 9) of the organic EL element with the quenching center being set to 540 nm are lower than those of (c) of FIG. 9 in the entire wavelength region of 400 nm or more and 700 nm or less, so that the contrast of 10 is met in the entire wavelength region. On the other hand, the ambient light reflectances ((b) of FIG. 9) of the organic EL element with the quenching center being set to 450 nm are higher than those of (c) of FIG. 9 in a wavelength region of 535 nm or more and 625 nm or less, so that a wavelength region in which the contrast of 10 is not met is present. The average contrast value in a wavelength region of 535 nm or more and 575 nm or less is 30 when the quenching center is set to 540 nm, and is 3.1 when the quenching center is set to 450 nm. In order to realize a display device having a high contrast, that is, good visibility, it is desirable to introduce the reflectance-adjusting layer according to the present invention to thereby expand the quenching band of ambient light and further to locate the quenching center thereof within the wavelength range of 535 nm or more and 575 nm or less.

As to the configuration of the reflectance-adjusting layers, the reflectance-adjusting layers may have a common thickness or stacking configuration irrespective of emission colors on the display device. Alternatively, the thickness or stacking configuration of the reflectance-adjusting layer may be changed for each of pixels different in emission color from each other individually. In order to improve the light emission efficiency of an organic EL element, there is required an effort to adjust an optical interference effect inside the element to increase the quantity of light substantially extracted to the outside of the element. For example, when an optical interference effect is to be adjusted by controlling an optical path between a light-emitting region in a light-emitting layer and a reflective electrode, an improvement in the light extraction efficiency can be expected by controlling the optical path such that Equation (6) below is met.

$$(2n-1)/4 \times \lambda = L \tag{6}$$

In Equation (6), L represents the optical path between the light-emitting region and the reflective electrode, $\lambda$ represents the peak wavelength of emitted light, and n represents an integer.

As is seen from Equation (6), because the optimum optical path varies depending on the peak wavelength of an emission color, in order to realize an organic EL element with a high external extraction efficiency, it is required to optimize the thickness of an organic compound layer for each emission color. Therefore, the ambient light reflection characteristics will vary for each emission color. With the display device of the present invention, when provided with a material having anomalous dispersion in the reflectance-adjusting layers, even in the case where the reflectance-adjusting layers have a common thickness and are constituted of a common material irrespective of emission color, a difference in ambient light reflection characteristics is hardly generated. Accordingly, even when light-emitting pixels showing different emission colors are provided with reflectance-adjusting layers which have a common thickness and a common stacking configuration, the reflection of ambient light can be effectively alleviated. The fact that the configurations of the reflectance-adjusting layers of all the light-emitting pixels are common irrespective of emission color as described above is preferable from the viewpoint of improving the throughput of display device production.

Alternatively, the thickness, material, and configuration such as number of the layers of the reflectance-adjusting layer may be optimized for each emission color individually. In that case, the degree of freedom in the adjustment of an optical interference effect on ambient light is improved, so that the reflection of ambient light can be quenched more effectively, and a display device having more excellent visibility than that in the case where a reflectance-adjusting layer common to respective colors is provided can be realized. In this case, furthermore, the quantity of light substantially extracted to the outside of the element can be increased by adjusting an optical interference effect inside the element, so that a load applied to the display device to cause the device to generate a predetermined luminance is alleviated. As a result, the power consumption of the display device can be reduced, and the lifetime of the device can be lengthened.

As described above, with the display device of the present invention, it is possible to arbitrarily make a selection as to whether the configuration of a reflectance-adjusting layer is optimized for each emission color or the configuration of reflectance-adjusting layers of respective pixels are made common to each other irrespective of emission color in consideration of the required characteristics and the throughput of the device production.

In addition, although in this embodiment the case where the reflectance-adjusting layers 8 are formed in all light-emitting pixels has been described, a configuration in which the reflectance-adjusting layers 8 are formed in part of the pixels of the display device may also be adopted. However, it is more preferable that all pixels are provided with the reflectance-adjusting layers 8 from the viewpoint of the visibility of the display device.

Meanwhile, although in this embodiment the case where the reflectance-adjusting layer 8 is provided between the cathode 7 and the protective layer 9 has been described, the position of provision of the reflectance-adjusting layer 8 is provided is not limited to the foregoing. The reflectance-adjusting layer 8 can be provided at any location of the display device as long as the function of preventing the reflection of ambient light is exhibited. Examples of the location of provision thereof include one between opposing electrodes of an organic EL element and one outside of the opposing electrodes. However, because the reflectance-adjusting layer 8 is provided for reducing the reflection of ambient light with the aid of interference, the layer 8 needs to be disposed at a location where an optical path difference is generated, that is, on a light extraction side with respect to the reflective layer 2.

In addition, the present invention exhibits a similar effect even in a so-called bottom emission type display device, in which emitted light is extracted from a substrate side, by providing the substrate side with a reflectance-adjusting layer. In addition, when the present invention is applied to an active matrix driven display device, a display device with a so-called top emission configuration in which light is extracted from the protective layer 9 side is advantageous from the viewpoint of the securement of an aperture ratio.

Figure 10:
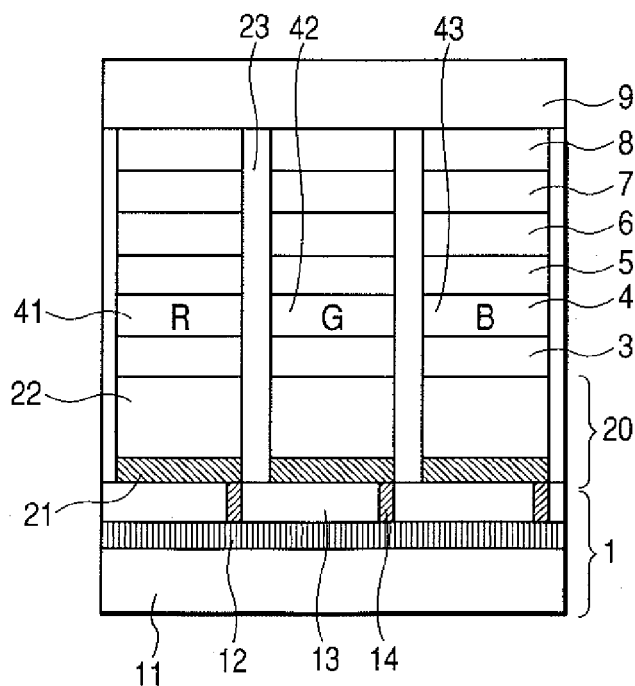
FIG. 10 is a schematic partial cross-sectional view showing another example of the display device of the present invention.

FIG. 10 is a schematic partial cross-sectional view showing another example of the display device of the present invention. The device shown in the figure is a top emission type active matrix display device.

The substrate 1 shown in FIG. 10 is composed of a support member 11, a TFT drive circuit 12, and a flattening layer 13. Examples of a material for use in the support member 11 include, but not particularly limited to, metals, ceramics, glass, and quartz. In addition, a flexible display apparatus can be produced by making a TFT drive circuit 12 on a flexible sheet such as a plastic sheet.

Reflective electrodes 20 are formed on the support member 11. The reflective electrodes 20 are each composed of a reflective layer 21 and a transparent conductive film 22 (i.e., transparent layer).

It is desirable that the reflective layer 21 has a reflectance at the interface with the transparent conductive film 22 of at least 50% or more, preferably 80% or more. Examples of a material used as the reflective layer 21 include, but not particularly limited to, a metal such as silver, aluminum, and chromium, and an alloy thereof.

As the transparent conductive film 22, there can be used an oxide conductive film, specifically, a compound film (ITO) composed of indium oxide and tin oxide, a compound film (IZO) composed of indium oxide and zinc oxide, or the like. The transparent conductive film 22 can be introduced as needed and is not a constitutional member which is essentially necessary for exhibiting the effect of the present invention. The transparent conductive film 22 is introduced for, for example, the purpose of reducing a barrier against carrier injection from the reflective layer 21 into an organic compound layer or the purpose of adjusting an optical length inside an element, or is introduced in, for example, the case where the reflective layer 21 is formed of an insulating member such as a dielectric multilayer film. Incidentally, the term "transparent" as employed herein refers to having a transmittance of 80% or more and 100% or less with respect to visible light. To be more specific, from the viewpoint of suppression of attenuation due to multiple reflection, the extinction coefficient κ is preferably 0.05 or less, more preferably 0.01 or less. The thickness of the transparent conductive film 22 is set depending on the refractive index thereof or the emission color of the display device and is desirably set in such a manner that the thickness of the hole-transporting layer 3 falls within the range of 10 nm or more and 200 nm or less, preferably 10 nm or more and 100 nm or less. This is because low-voltage driving is advantageous from the viewpoint of power consumption.

Incidentally, this embodiment is an example of the case where each of the reflective layers 21 is formed of a metal material. The reflective layers 21 and the TFT drive circuit 12 are electrically connected through contact holes 14. If the reflective layer 21 is an insulating member, the transparent conductive films 22 and the TFT drive circuit 12 may be connected electrically through the contact holes 14.

The reflective electrodes 20 are patterned for the respective pixels, and are isolated from each other by element isolation films 23. It is preferable that the element isolation films 23 is constituted of a member that absorbs ambient light such as a resin containing carbon black so that the reflection of ambient light between pixels may be prevented and a display device having a higher contrast may be realized.

The organic compounds for use in the hole-transporting layer 3, the light-emitting layer 4, the electron-transporting layer 5, and the electron injection layer 6 may be a low-molecular material, a high-molecular material (polymer), or a combination of the both materials, and are not particularly limited. Any hitherto known material can be used as needed.

Hereinafter, examples of those compounds are enumerated.

As the hole transportable material, there are preferably used those having excellent mobility which facilitates the injection of holes from the anode and the transportation of the injected holes to the light-emitting layer. In addition, a hole-injecting layer may be interposed between the anode and the hole-transporting layer as needed. Examples of low-molecular and high-molecular materials having hole injecting/transporting property include, but of course not limited to, a triarylamine derivative, a phenylenediamine derivative, a triazole derivative, an oxadiazole derivative, an imidazole derivative, a pyrazoline derivative, a pyrazolone derivative, an oxazole derivative, a fluorenone derivative, a hydrazone derivative, a stilbene derivative, a phthalocyanine derivative, a porphyrin derivative, poly(vinylcarbazole), poly(silylene), poly(thiophene), and other conductive polymers. A part of specific examples of the materials are shown below.

Low-molecular hole injecting/transporting material

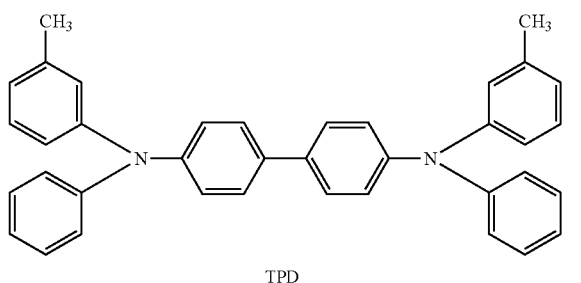

TPD

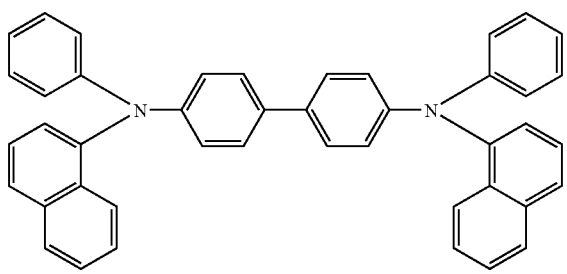

α-DPD

-continued

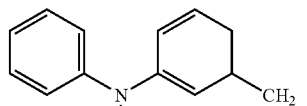

m-MTDATA

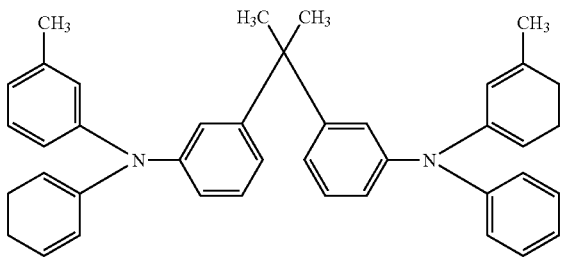

MTDPDL

High-molecular hole transporting material

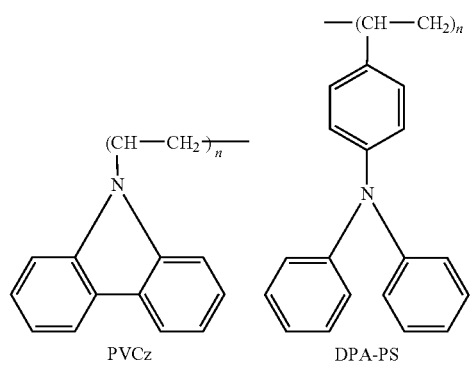

PVCz          DPA-PS

-continued
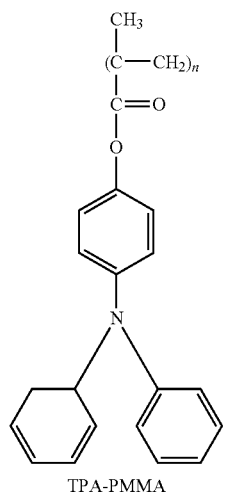
TPA-PMMA
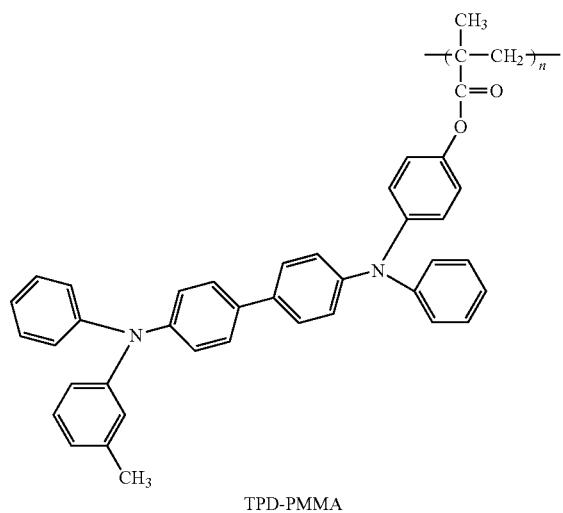
TPD-PMMA
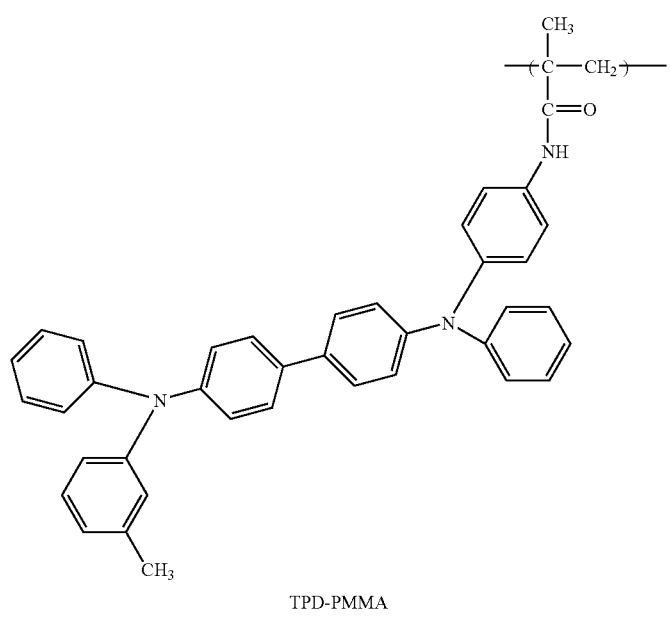
TPD-PMMA
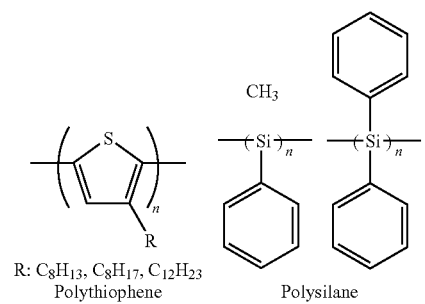
R: $C_8H_{13}$, $C_8H_{17}$, $C_{12}H_{23}$
Polythiophene          Polysilane

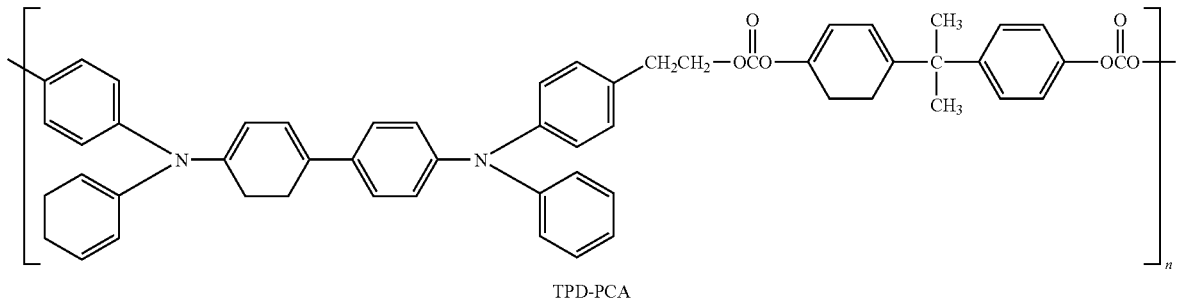
TPD-PCA
As a light-emitting material, a fluorescent dye or phosphorescent material having a high emission efficiency is used. A part of specific examples of the dye or material are enumerated below.
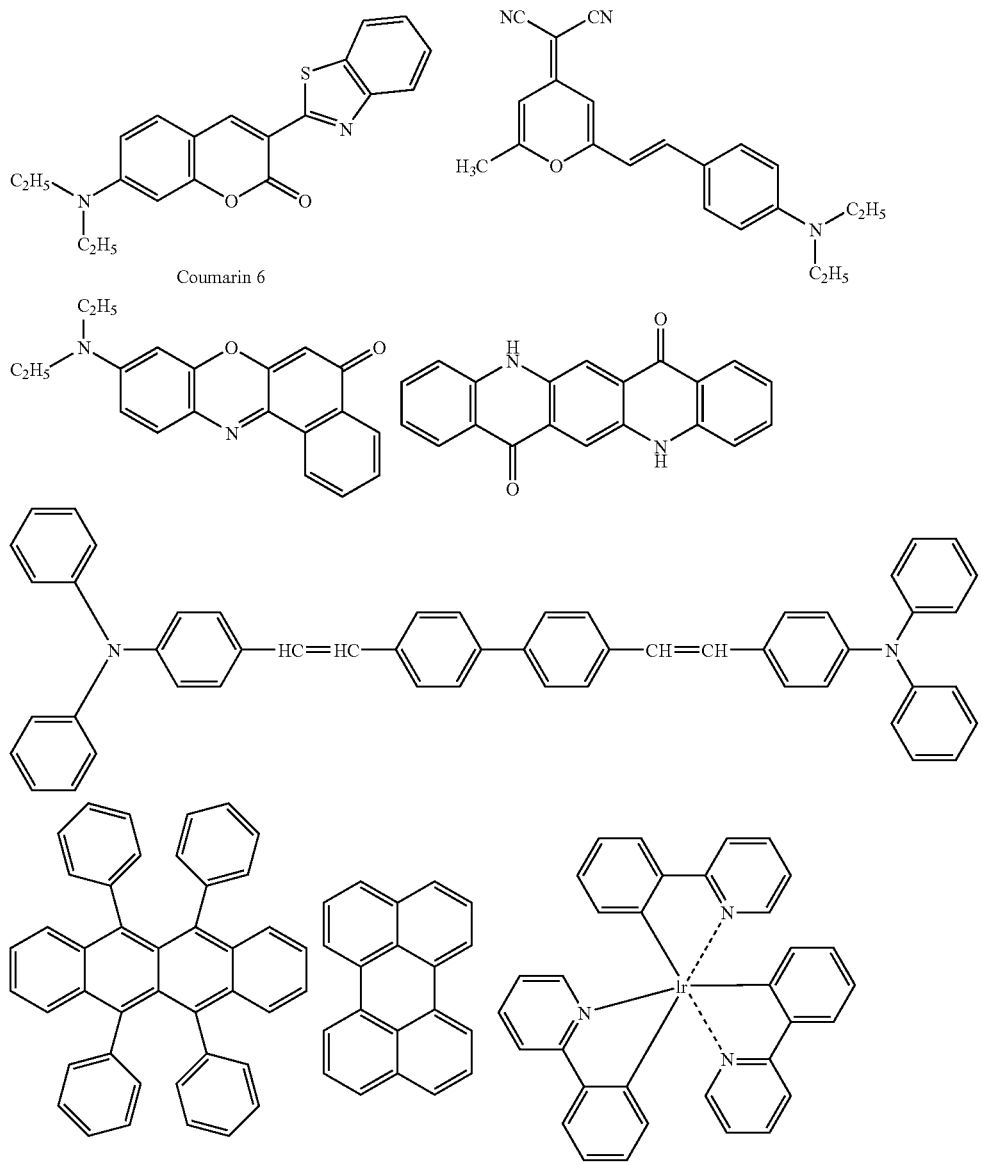
Coumarin 6

The electron transportable material can be arbitrarily selected from those having a function of transporting injected electrons to the light-emitting layer, and is selected in consideration of, for example, a balance with the carrier mobility of the hole-transporting material. Examples of a material having electron injecting/transporting property include, but of course not limited to, an oxadiazole derivative, an oxazole derivative, a thiazole derivative, a thiadiazole derivative, a pyrazine derivative, a triazole derivative, a triazine derivative, a perylene derivative, a quinoline derivative, a quinoxaline derivative, a fluorenone derivative, an anthrone derivative, a phenanthroline derivative, and an organometallic complex. A part of specific examples of the material are enumerated below.

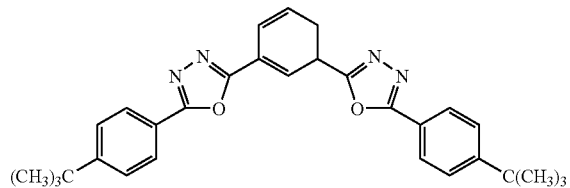

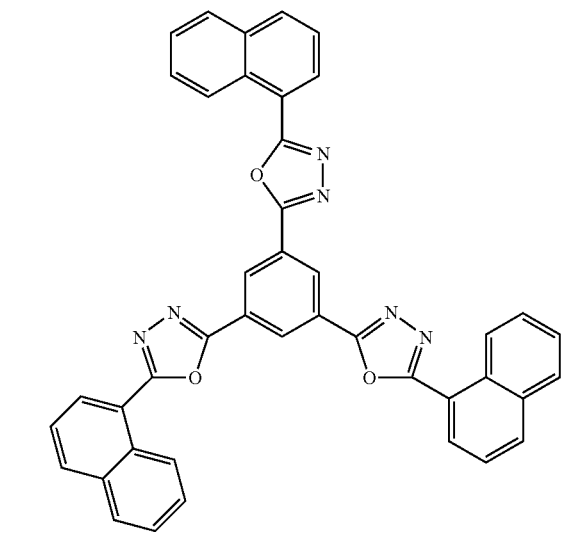

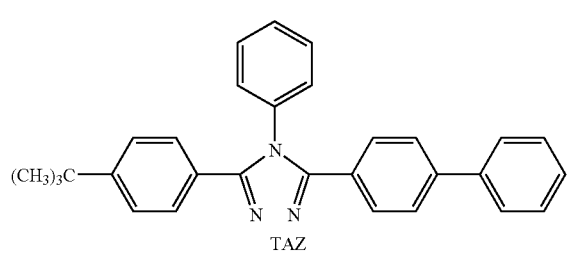

TAZ

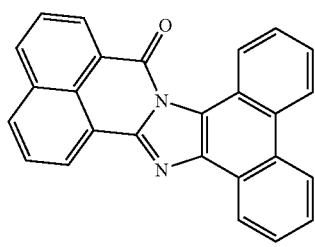

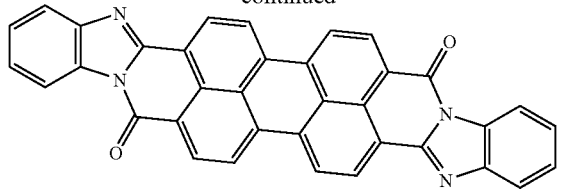

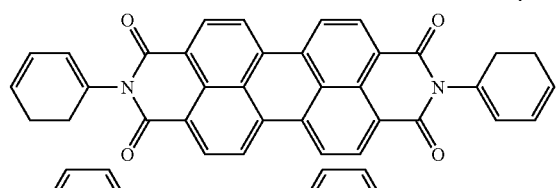

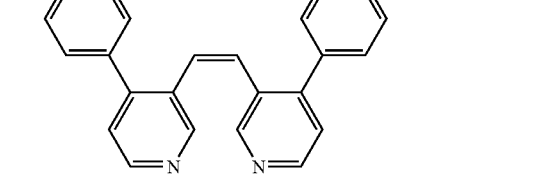

Bphen

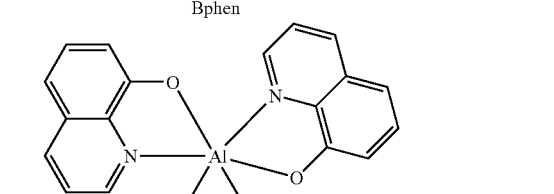

Alq

Further, as the electron-injecting material, electron-injecting property can be imparted to the above-mentioned electron transportable material by incorporating 0.1 percent to several tens percent of an alkali metal or alkali earth metal, or a compound thereof into the material. Although the electron injection layer 6 is not an indispensable layer, it is preferable to provide an electron injection layer of about 10 to 100 nm in thickness, for securing good electron-injecting property in consideration of damage given at the time of film formation of the transparent cathode 7 in a subsequent production step.

These organic compound layers can be generally formed by means of, for example, a vacuum evaporation method, an ionized evaporation method, sputtering, or plasma. Alternatively, they can be formed by: dissolving an organic compound into an appropriate solvent; and applying the solution by means of a known application method such as spin coating, dipping, a casting method, an LB method, or an ink-jet method. In particular, when a film is formed by means of an application method, the film can be formed of such an organic compound in combination with an appropriate binder resin. The binder resin can be selected from a wide variety of binding resins, and examples of the binder resin include, but not limited to, a polyvinyl carbazole resin, a polycarbonate resin, a polyester resin, a polyallylate resin, a polystyrene resin, an ABS resin, a polybutadiene resin, a polyurethane resin, an acrylic resin, a methacrylic resin, a butyral resin, a polyvinyl acetal resin, a polyamide resin, a polyimide resin, a polyethylene resin, a polyethersulfone resin, a diallyl phthalate resin, a phenol resin, an epoxy resin, a silicone resin, a polysulfone resin, and a urea resin. Further, these resins may be used singly or in combination as a copolymer. Moreover, a known additive such as a plasticizer, an antioxidant, or a UV absorber may be used in combination as needed.

As the cathode 7, there is used an oxide conductive film such as of ITO and IZO described above, a semi-transparent cathode formed of a thin film made of a metal such as silver or aluminum or an alloy thereof, or a combination of a semi-transparent cathode and an oxide conductive film. The material of the cathode 7 is desirably selected suitably in consideration of the combination of the electron-transporting layer 5 and the electron injection layer 6 such that good electron injection property can be obtained. The cathodes 7 of the respective light-emitting pixels may be constituted of a common material and may have a common film thickness and configuration. Alternatively, the film thickness, material and configuration of the cathode 7 may be set for each light-emitting pixel individually. In addition, the cathode 7 may be formed by any method, and can be formed by, for example, sputtering or evaporation.

The reflectance-adjusting layer 8 is as described with reference to FIG. 1.

The protective layer 9 is provided for the purpose of preventing contact with oxygen, water, or the like. Examples of a material of the protective layer 9 include a metal nitride film such as of silicon nitride or silicon nitride oxide; a metal oxide film such as of tantalum oxide; a diamond thin film; a polymer film such as of a fluororesin, polyparaxylene, polyethylene, a silicone resin, or a polystyrene resin; and a photocurable resin. Alternatively, an element may be covered with glass, a gas impermeable film, a metal, or the like, or an element itself may be packaged in an appropriate sealing (or encapsulating) resin. Moreover, in order to improving moisture resistance, a hygroscopic material may be contained in the protective layer.

Figure 11:
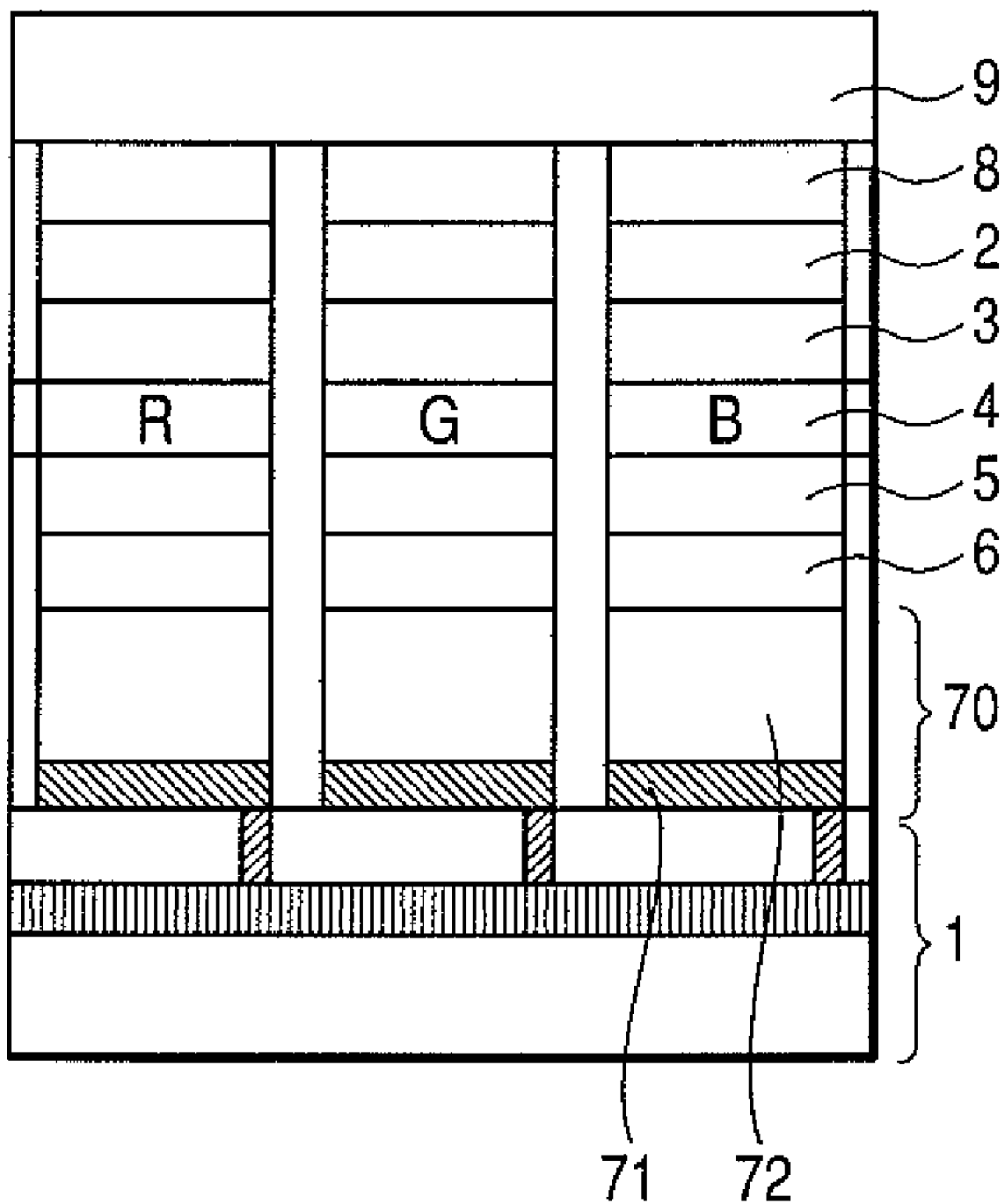
FIG. 11 is a schematic partial cross-sectional view showing still another example of the display device of the present invention.

Incidentally, although description has been made by taking as an example the configuration in which an anode is positioned on the TFT drive circuit 12 side, a reverse configuration such as shown in FIG. 11 is also available. That is, there are sequentially stacked on a substrate 1, a reflective electrode 70 which is constituted of a reflective layer 71 and a transparent conductive film 72 and functions also as a cathode, an electron injection layer 6, an electron-transporting layer 5, a light-emitting layer 4, a hole-transporting layer 3, a transparent anode 2, a reflectance-adjusting layer 8, and a protective layer 9.

Further, the present invention can be practiced even in a bottom emission constitution obtained by: stacking a reflectance-adjusting layer on a transparent substrate; and stacking a transparent electrode, an organic compound layer, and a reflective electrode thereon, and the present invention is not particularly limited.

In addition, although in this embodiment description has been made by taking the active matrix display device as an example, the present invention is also applicable to a passive matrix display device and is not particularly limited.

Preferable applications of the display device of the present invention include, but not particularly limited to, televisions, monitors for digital still cameras and digital camcorders, mobile phones, and display screens for PDAs and computers.

EXAMPLES

Hereinafter, the present invention will be described more specifically by way of examples. However, the present invention is not limited to those examples.

Example 1

Figure 12:
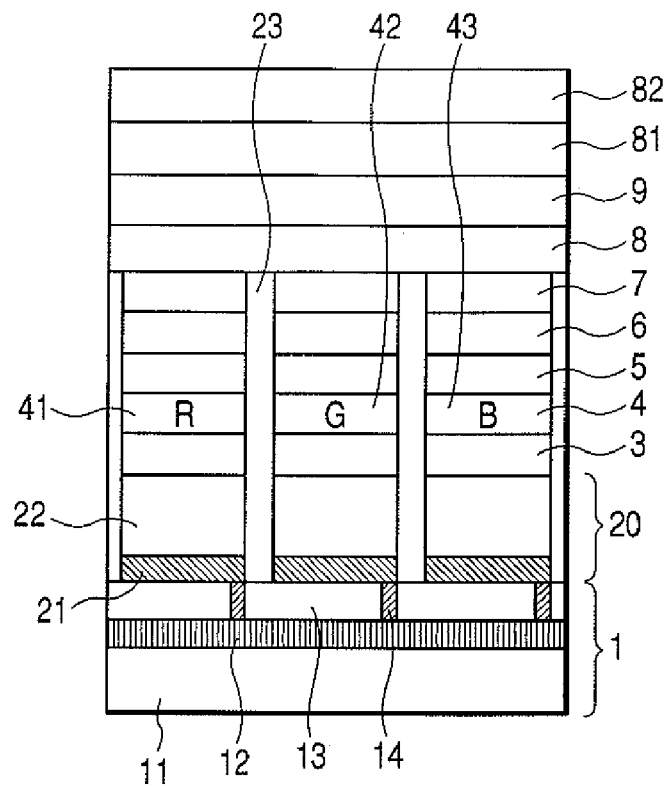
FIG. 12 is a schematic partial cross-sectional view showing a display device of Example 1.

A display device of three colors R, G, and B having a structure shown in FIG. 12 was produced by the following method.

On a glass sheet as a support member 11 was formed a TFT drive circuit 12 composed of low-temperature polysilicon, and a flattening layer 13 composed of an acrylic resin was formed thereon to prepare a substrate 1.

A reflective layer 21 was formed thereon by sputtering an aluminum alloy (AlNiPd) in a thickness of about 100 nm, followed by patterning. Further, a transparent conductive film 22 was formed thereon by sputtering IZO in a thickness of 20 nm, followed by patterning, whereby the reflective electrode 20 was formed. Further, an element separation film 23 was formed of an acrylic resin, whereby the substrate having the reflective electrode 20 formed thereon was prepared. The thus prepared substrate was subjected to ultrasonic cleaning with isopropyl alcohol (IPA), and was then subjected to boil washing followed by drying. Further, the dried member was subjected to UV/ozone washing, and then an organic compound layer was formed thereon by vacuum evaporation.

First, Compound [I] represented by the following structural formula was formed into a film in a thickness of 20 nm for each of all pixels to prepare a common hole-transporting layer 3. At this time, the degree of vacuum was $1 \times 10^{-4}$ Pa and the evaporation rate was 0.2 nm/sec.

Compound [I]

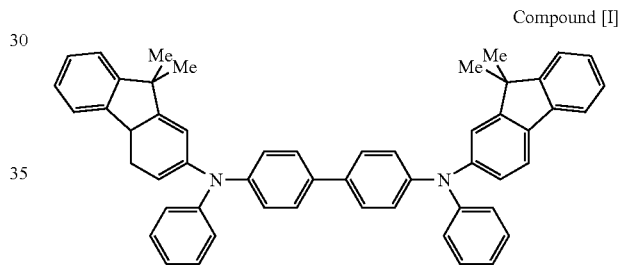

Next, a light-emitting layer for each of R, G, and B colors was formed as the light-emitting layer 4 by using a shadow mask. Alq3 (as a host) and 4-(dicyanomethylene)-2-methyl-6-(p-dimethylaminostyryl)-4H-pyran (DCM) (as a light-emitting compound) were co-evaporated (at a weight ratio of 99:1), thereby providing an R-light-emitting layer 42 having a thickness of 20 nm. Alq3 (as a host) and coumarin 6 (as a light-emitting compound) were co-evaporated (at a weight ratio of 99:1), thereby providing a G-light-emitting layer 42 having a thickness of 20 nm. Compound [II] shown below (as a host) and Compound [III] (as a light-emitting) were co-evaporated (at a weight ratio of 80:20), thereby providing a B-light-emitting layer 43 having a thickness of 20 nm. The film formation was performed under the conditions upon evaporation including a degree of vacuum of $1 \times 10^{-4}$ Pa and a film formation rate of 0.2 nm/sec.

Compound [II]

-continued

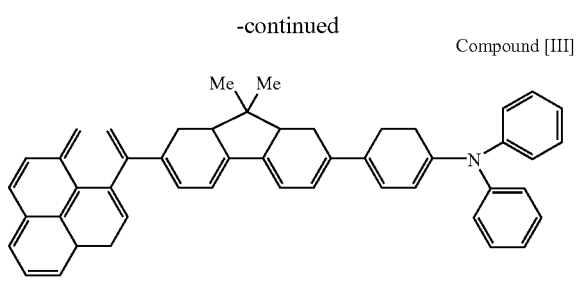

Compound [III]

Further, bathophenanthroline (Bphen) was formed into a film having a thickness of 10 nm as a common electron-transporting layer 5 by a vacuum evaporation method. The evaporation was performed under the conditions including a degree of vacuum of $1\times10^{-4}$ Pa and a film formation rate of 0.2 nm/sec.

Next, Bphen and $Cs_2CO_3$ were co-evaporated (at a weight ratio of 90:10) to be formed into a film having a thickness of 30 nm as a common electron injection layer 6. The evaporation was performed under the conditions including a degree of vacuum of $3\times10^{-4}$ Pa and a film formation rate of 0.2 nm/sec.

Then, silver (Ag) was formed into a film having a thickness of 10 nm as a cathode 7. The degree of vacuum at the time of evaporation was $1\times10^{-4}$ Pa and the film formation rate was 0.2 nm/sec.

The substrate having the layers up to and including the cathode 7 formed thereon was transferred to a sputtering apparatus without breaking the vacuum. A film of $SiO_2$ was formed in a thickness of 150 nm thereon; a film of tungsten carbide (WC) having anomalous dispersibility was then formed in a thickness of 25 nm thereon; and a film of $SiO_2$ was further formed in a thickness of 30 nm thereon, thereby providing a reflectance-adjusting layer 8 with a three-layer configuration. After that, a film of silicon nitride oxide was formed in a thickness of 350 nm as a protective layer 9.

Subsequently, the substrate having the layers up to and including the protective layer 9 formed thereon was taken out of the sputtering apparatus. An acrylic resin sheet having a thickness of 500 μm as a resin layer 81 was bonded to the protective layer 9. Further, a glass plate 82 having a thickness of 700 μm was bonded to the resin layer 81, whereby a display device was obtained.

Figure 13:
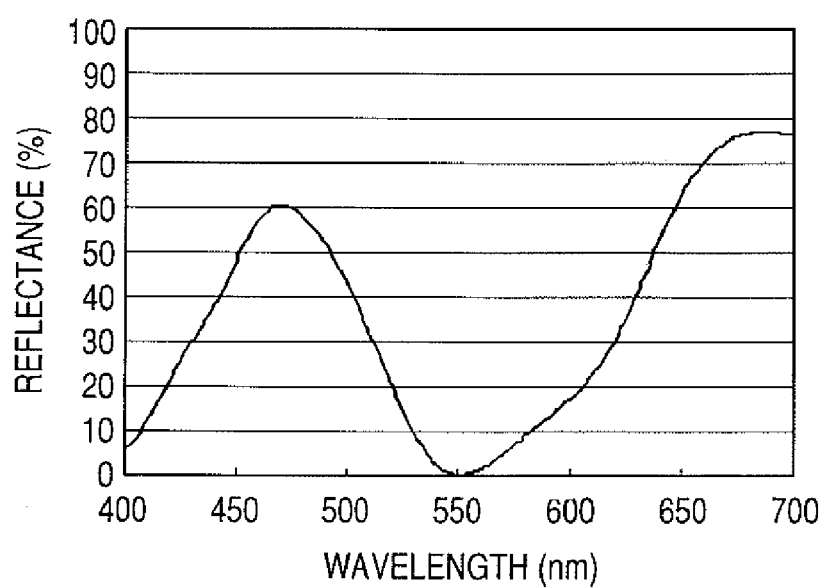
FIG. 13 is a graphical representation showing the ambient light reflection characteristics of the display device of Example 1.

FIG. 13 shows the ambient light reflection characteristics of the display device thus obtained. In addition, Table 5 shows the following characteristics of the respective R, G, and B pixels of the display device.

(1) Emission efficiency
(2) Chromaticity coordinates
(3) Average contrast value in a wavelength region of 535 nm or more and 575 nm or less in a bright location corresponding to a brightness of 1,500 lux at an emission luminance of 100 cd/m²
(4) Power consumption when a white color (color purity: 0.32, 0.33) is displayed at an emission luminance of 100 cd/m²

Example 2

A display device was produced by following the same procedure as in Example 1 with the exception that the thickness of the organic compound layer and the thickness of the reflectance-adjusting layer were optimized for each emission color individually as shown in Table 3.

Figure 14:
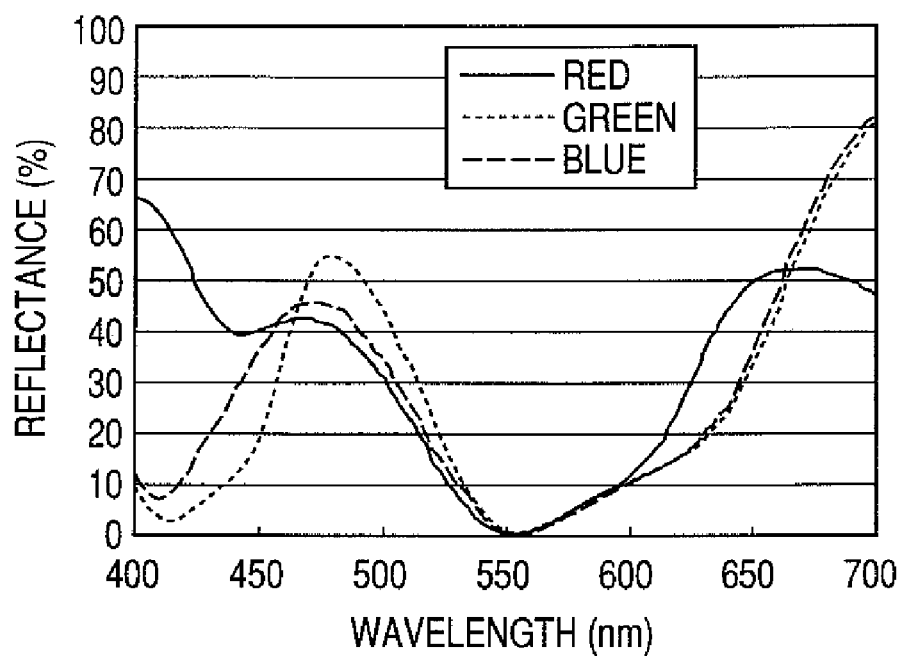
FIG. 14 is a graphical representation showing the ambient light reflection characteristics of a display device of Example 2.

FIG. 14 shows the ambient light reflection characteristics of the display device thus obtained. In this example, the ambient light reflection characteristics vary for each light-emitting pixel because the film thickness is set for each emission color individually. In addition, Table 5 shows the results of the evaluation made in a manner similar to that of Example 1. Incidentally, the contrast value in this example is the average of the contrast values of the respective R, G, and B light-emitting pixels.

TABLE 3

|  |  | Red | Green | Blue |
|---|---|---|---|---|
| Reflectance-adjusting layer | SiO₂ | 30 nm | 30 nm | 30 nm |
|  | WC | 25 nm | 25 nm | 30 nm |
|  | SiO₂ | 95 nm | 180 nm | 180 nm |
| Cathode |  | 10 nm | 10 nm | 10 nm |
| Electron injection layer |  | 30 nm | 10 nm | 10 nm |
| Electron-transporting layer |  | 10 nm | 10 nm | 10 nm |
| Light-emitting layer |  | 30 nm | 30 nm | 20 nm |
| Hole-transporting layer |  | 30 nm | 20 nm | 20 nm |
| Transparent conductive film |  |  | 20 nm |  |
| Reflective layer |  |  | 100 nm |  |

Comparative Example 1

Figure 15:
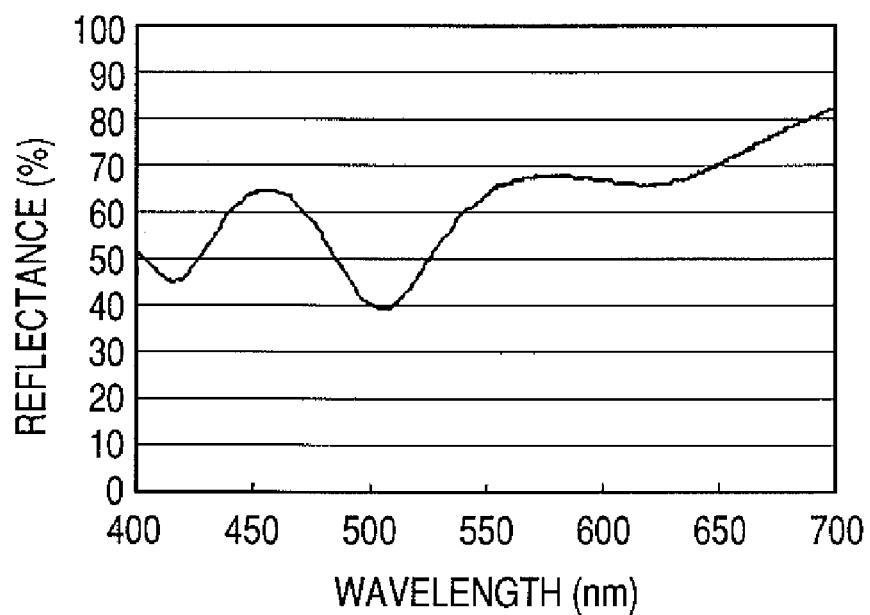
FIG. 15 is a graphical representation showing the ambient light reflection characteristics of a display device of Comparative Example 1.

A display device was produced by following the same procedure as in Example 1 with the exception that the reflectance-adjusting layer was not provided. FIG. 15 shows the ambient light reflection characteristics of the display device thus obtained. In addition, Table 5 shows the results of the evaluation made in a manner similar to that of Example 1. The average contrast value in the wavelength region of 535 nm or more and 575 nm or less of the display device was as low as 1.33, so that no displayed image could be visually observed out of doors in the daylight.

Comparative Example 2

Figure 16:
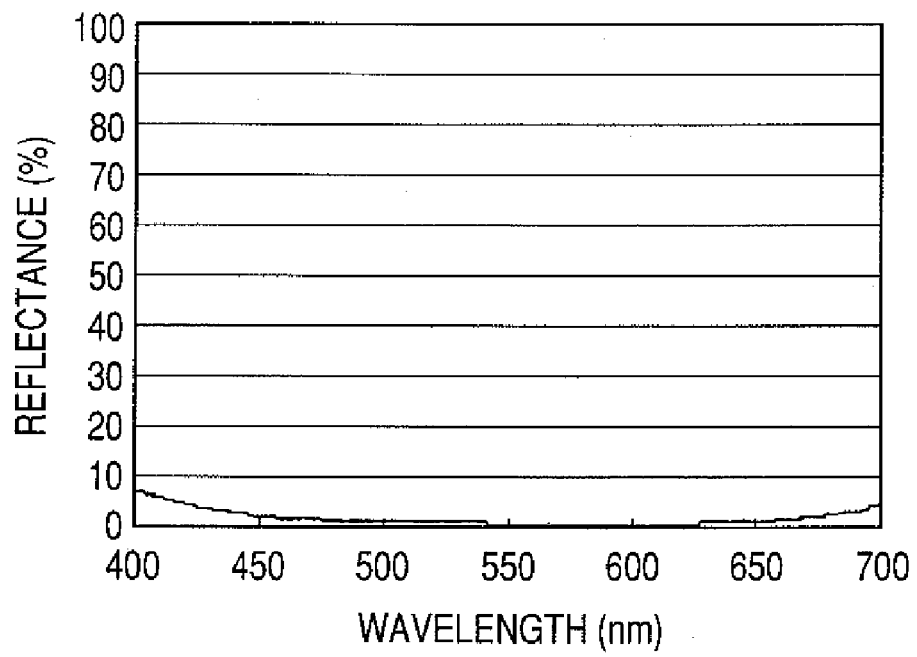
FIG. 16 is a graphical representation showing the ambient light reflection characteristics of a display device of Comparative Example 2.

A display device was produced by following the same procedure as in Comparative Example 1 with the exception that a circularly polarizing plate was provided at the light extraction surface of the display device. FIG. 16 shows the ambient light reflection characteristics of the display device thus obtained. In addition, Table 5 shows the results of the evaluation made in a manner similar to that of Example 1. Incidentally, the transmittance of EL emitted light in the circularly polarizing plate used in this comparative example was approximately 45%.

TABLE 4

|  | Red | Green | Blue |
|---|---|---|---|
| Cathode | 10 nm | 10 nm | 10 nm |
| Electron injection layer | 40 nm | 50 nm | 20 nm |
| Electron-transporting layer | 10 nm | 10 nm | 10 nm |
| Light-emitting layer | 20 nm | 10 nm | 10 nm |
| Hole-transporting layer | 40 nm | 20 nm | 30 nm |
| Transparent conductive film |  | 20 nm |  |
| Reflective layer |  | 100 nm |  |

Comparative Example 3

Figure 17:
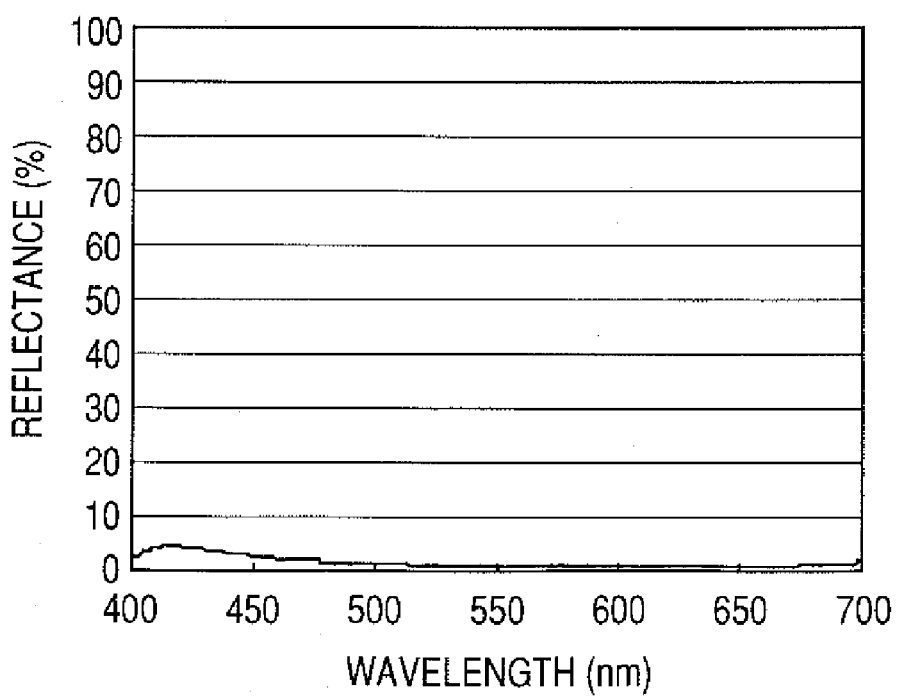
FIG. 17 is a graphical representation showing the ambient light reflection characteristics of a display device of Comparative Example 3.

A display device was produced by following the same procedure as in Comparative Example 2 with the exception that the thickness of the organic compound layer was optimized for each emission color individually as shown in Table 4. FIG. 17 shows the ambient light reflectance of the display device thus obtained. In addition, Table 5 shows the results of the evaluation made in a manner similar to that of Example 1.

TABLE 5

|  |  | Red | Green | Blue |
|---|---|---|---|---|
| Ex. 1 | Efficiency (cd/A) | 16.2 | 11.6 | 2.0 |
|  | CIE chromaticity coordinates | (0.64, 0.35) | (0.34, 0.61) | (0.15, 0.13) |
|  | Contrast |  | 65.2 |  |
|  | Power consumption (mW) |  | 380 |  |
| Ex. 2 | Efficiency (cd/A) | 24.5 | 10.0 | 1.5 |
|  | CIE chromaticity coordinates | (0.66, 0.34) | (0.29, 0.64) | (0.14, 0.08) |
|  | Contrast |  | 73.4 |  |
|  | Power consumption (mW) |  | 343 |  |
| Comp. Ex. 1 | Efficiency (cd/A) | 18.0 | 24.8 | 4.6 |
|  | CIE chromaticity coordinates | (0.63, 0.36) | (0.28, 0.66) | (0.14, 0.20) |
|  | Contrast |  | 1.33 |  |
|  | Power consumption (mW) |  | 239 |  |
| Comp. Ex. 2 | Efficiency (cd/A) | 8.1 | 11.2 | 2.1 |
|  | CIE chromaticity coordinates | (0.63, 0.36) | (0.28, 0.66) | (0.14, 0.20) |
|  | Contrast |  | 29.2 |  |
|  | Power consumption (mW) |  | 532 |  |
| Comp. Ex. 3 | Efficiency (cd/A) | 14.8 | 12.1 | 2.0 |
|  | CIE chromaticity coordinates | (0.65, 0.31) | (0.29, 0.66) | (0.13, 0.15) |
|  | Contrast |  | 18.1 |  |
|  | Power consumption (mW) |  | 401 |  |

Comparative Example 4

In this comparative example, a multicolor display device was produced by following the same procedure as in Example 1 with the exception that the reflectance-adjusting layer was constituted of $SiO_2$ and $TiO_2$ each having no anomalous dispersibility and that the thickness of the organic compound layer and the thickness of the reflectance-adjusting layer were made identical for each emission color, respectively. Table 6 shows the thicknesses of the organic compound layers and the reflectance-adjusting layers collectively.

Figure 18:
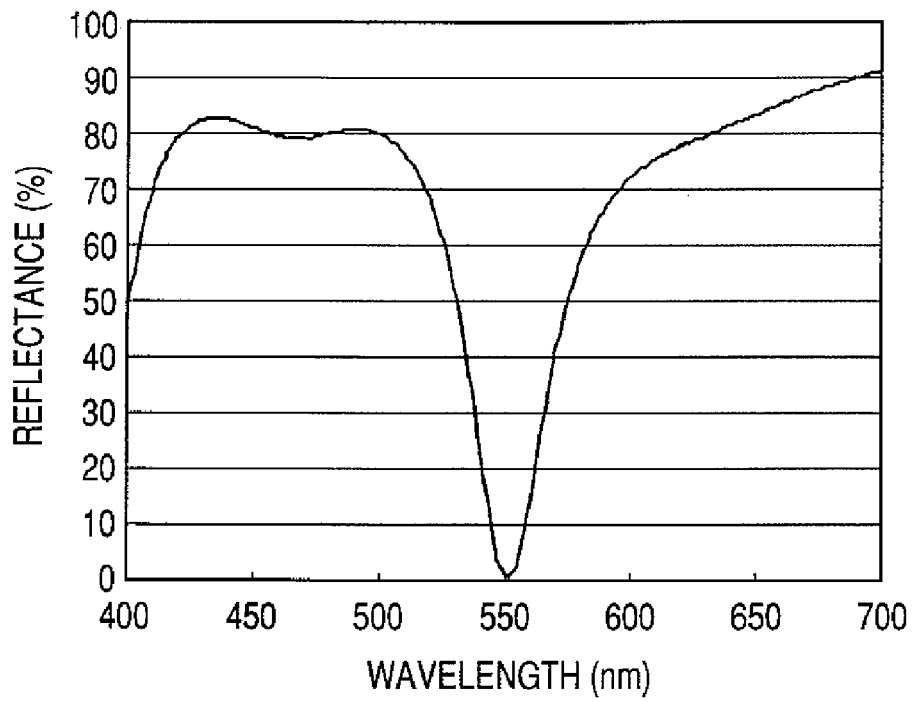
FIG. 18 is a graphical representation showing the ambient light reflection characteristics of a display device of Comparative Example 4.

FIG. 18 shows the ambient light reflection characteristics of the multicolor display device thus obtained. In addition, Table 7 shows the results of the evaluation of the multicolor display device made in a manner similar to that of Example 1.

Comparative Example 5

In this comparative example, a multicolor display device was produced by following the same procedure as in Example 1 with the exception that the reflectance-adjusting layer was constituted of $SiO_2$ and $TiO_2$ each having no anomalous dispersibility and that the thickness of the organic compound layer and the thickness of the reflectance-adjusting layer were optimized for each emission color, respectively. Table 6 shows the thicknesses of the organic compound layers and the reflectance-adjusting layers collectively.

Figure 19:
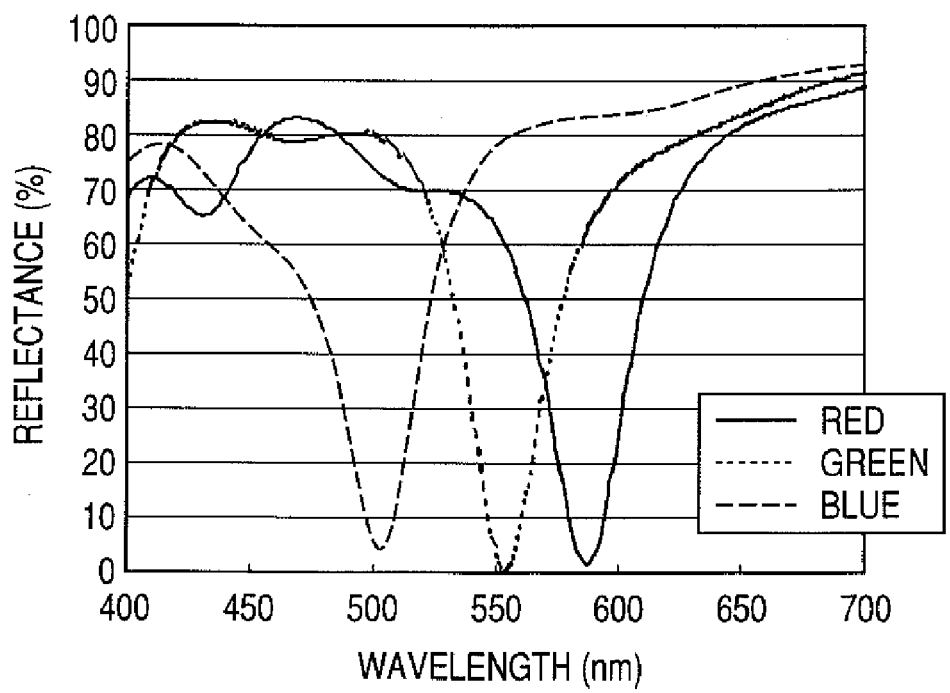
FIG. 19 is a graphical representation showing the ambient light reflection characteristics of a display device of Comparative Example 5.
Figure 20:
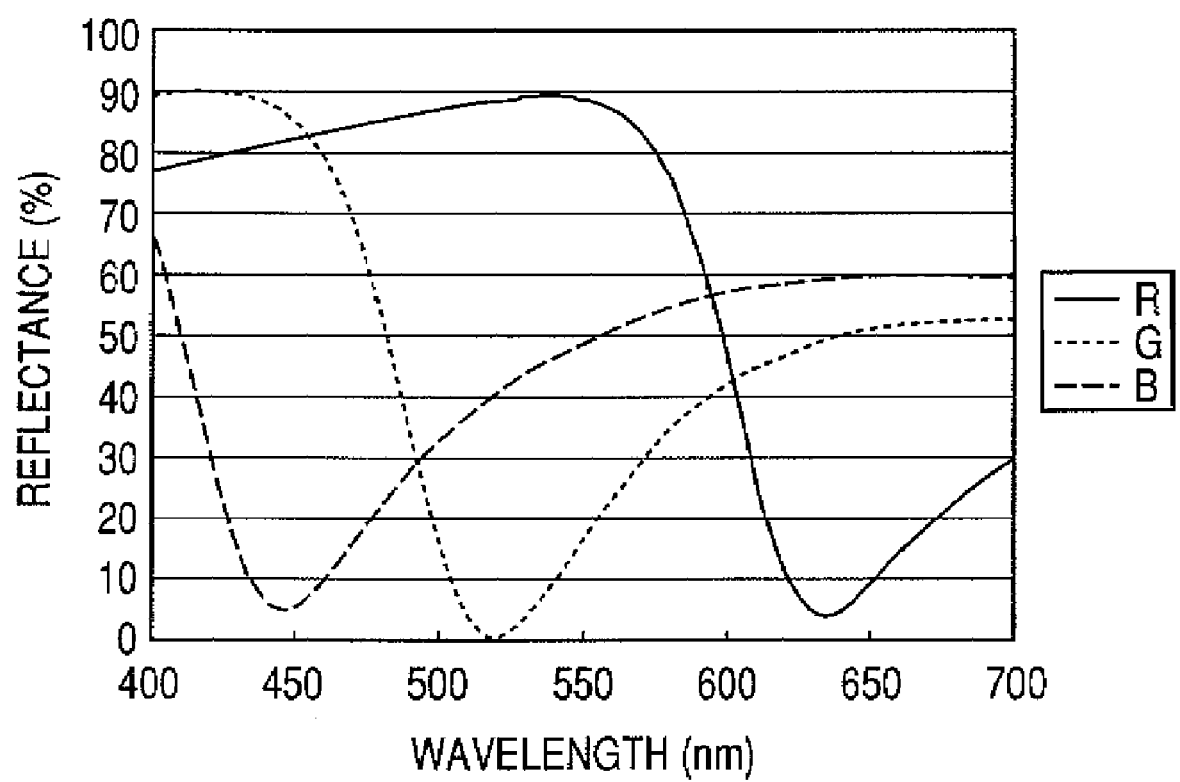
FIG. 20 is a graphical representation showing the ambient light reflection characteristics of a conventional organic EL element.

FIG. 19 shows the ambient light reflection characteristics of the multicolor display device thus obtained. In addition, Table 7 shows the results of the evaluation of the multicolor display device made in a manner similar to that of Example 1. Incidentally, the contrast value in this comparative example is the average of the contrast values of the respective R, G, and B light-emitting pixels.

TABLE 6

|  |  | Comparative Example 4 | | | Comparative Example 5 | | |
|---|---|---|---|---|---|---|---|
|  |  | Red | Green | Blue | Red | Green | Blue |
| Reflectance-adjusting layer | $SiO_2$ |  | 66 nm |  | 140 nm | 70 nm | 70 nm |
|  | $TiO_2$ |  | 70 nm |  | 65 nm | 60 nm | 70 nm |
|  | $SiO_2$ |  | 60 nm |  | 80 nm | 80 nm | 70 nm |
| Cathode |  |  | 10 nm |  | 10 nm | 10 nm | 10 nm |
| Electron injection layer |  |  | 16 nm |  | 20 nm | 23 nm | 32 nm |
| Electron-transporting layer |  |  | 10 nm |  | 10 nm | 10 nm | 10 nm |
| Light-emitting layer |  |  | 20 nm |  | 30 nm | 30 nm | 20 nm |
| Hole-transporting layer |  |  | 40 nm |  | 30 nm | 20 nm | 20 nm |
| Transparent conductive film |  |  | 20 nm |  |  | 20 nm |  |
| Reflective layer |  |  | 100 nm |  |  | 100 nm |  |

TABLE 7

|  |  | Red | Green | Blue |
|---|---|---|---|---|
| Comp. Ex. 4 | Efficiency (cd/A) | 9.8 | 24.4 | 2.3 |
|  | CIE chromaticity coordinates | (0.60, 0.39) | (0.37, 0.61) | (0.18, 0.24) |
|  | Contrast |  | 4.7 |  |
|  | Power consumption (mW) |  | 554 |  |
| Comp. Ex. 5 | Efficiency (cd/A) | 19.1 | 23.3 | 3.8 |
|  | CIE chromaticity coordinates | (0.64, 0.36) | (0.37, 0.61) | (0.11, 0.29) |
|  | Contrast |  | 3.7 |  |
|  | Power consumption (mW) |  | 383 |  |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims priority from Japanese Patent Application Nos. 2005-283896 filed on Sep. 29, 2005, 2006-250565 filed on Sep. 15, 2006, which are hereby incorporated by reference herein.

What is claimed is:

1. A display device comprising a plurality of organic EL elements each having a light extraction electrode, a reflective electrode, and a plurality of organic compound layers disposed between the electrodes, wherein the plurality of organic EL elements include at least organic EL elements which emit a red light, a green light, and a blue light, respectively; a layer comprising a material having anomalous dispersion is disposed at a location which is on a light extraction side with respect to the reflective electrode in each of the plurality of organic EL elements; and an ambient light reflectance of the display device shows a minimum in a region from 535 nm to 575 nm, wherein the material having anomalous dispersion has an extinction coefficient k of 3 or less.

2. A display device comprising a plurality of organic EL elements each having a light extraction electrode, a reflective electrode, and a plurality of organic compound layers disposed between the electrodes, wherein the plurality of organic EL elements include at least organic EL elements which emit a red light, a green light, and a blue light, respectively; a layer comprising a material having anomalous dispersion is disposed at a location which is on a light extraction side with respect to the reflective electrode in each of the plurality of organic EL elements; and an ambient light reflectance of the display device shows a minimum in a region from 535 nm to 575 nm, wherein the material having anomalous dispersion comprises tungsten carbide.

3. The display device according to claim 2, wherein an optical path adjusting layer is disposed in contact with the layer comprising the material having anomalous dispersion.

4. The display device according to claim 3, wherein the thicknesses of the layer comprising the material having anomalous dispersion and the optical path adjusting layer are identical for each of the plurality of organic EL elements, respectively.

5. The display device according to claim 3, wherein the thicknesses of the layer comprising the material having anomalous dispersion and the optical path adjusting layer are optimized for each of the plurality of organic EL elements.

* * * * *